US009093988B2

(12) United States Patent
Yamazaki et al.

(10) Patent No.: US 9,093,988 B2
(45) Date of Patent: *Jul. 28, 2015

(54) SEMICONDUCTOR DEVICE AND METHOD FOR DRIVING SEMICONDUCTOR DEVICE

(71) Applicant: Semiconductor Energy Laboratory Co., Ltd., Atsugi (JP)

(72) Inventors: Shunpei Yamazaki, Tokyo (JP); Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/961,073

(22) Filed: Aug. 7, 2013

(65) Prior Publication Data
US 2014/0043094 A1 Feb. 13, 2014

(30) Foreign Application Priority Data

Aug. 10, 2012 (JP) ................................. 2012-178536

(51) Int. Cl.
*H03B 1/00* (2006.01)
*H03K 3/012* (2006.01)
*H01L 27/092* (2006.01)
*H03K 3/03* (2006.01)
*H01L 27/06* (2006.01)
(Continued)

(52) U.S. Cl.
CPC ............ *H03K 3/012* (2013.01); *H01L 27/0688* (2013.01); *H01L 27/092* (2013.01); *H01L 27/1225* (2013.01); *H03K 3/0315* (2013.01); *H01L 29/78648* (2013.01)

(58) Field of Classification Search
USPC ............ 327/108–112, 389, 391, 427; 326/26, 326/27, 82, 83
See application file for complete search history.

(56) References Cited

U.S. PATENT DOCUMENTS

| 5,274,601 A | 12/1993 | Kawahara et al. |
| 5,731,856 A | 3/1998 | Kim et al. |
| 5,744,864 A | 4/1998 | Cillessen et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Long Nguyen
(74) *Attorney, Agent, or Firm* — Fish & Richardson P.C.

(57) ABSTRACT

A semiconductor device includes a first transistor having a p-channel type, a second transistor having an n-channel type, and a third transistor with low off-state current between a high potential power supply line and a low potential power supply line, and a source terminal and a drain terminal of the third transistor are connected so that the third transistor is connected in series with the first transistor and the second transistor between the high potential power supply line and the low potential power supply line, and the third transistor is turned off when both the first transistor and the second transistor are in conducting states.

18 Claims, 15 Drawing Sheets

(51) Int. Cl.
*H01L 27/12* (2006.01)
*H01L 29/786* (2006.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,207,756 B2 | 6/2012 | Shionoiri et al. |
| 8,400,187 B2 | 3/2013 | Yamazaki et al. |
| 8,878,574 B2* | 11/2014 | Yamazaki et al. | 327/109 |
| 8,975,930 B2* | 3/2015 | Yamazaki et al. | 327/108 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197892 A1* | 8/2008 | Osawa | 327/108 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101333 A1 | 5/2011 | Shionoiri et al. |
| 2011/0140099 A1 | 6/2011 | Yamazaki |
| 2011/0278564 A1 | 11/2011 | Yoneda |
| 2012/0292616 A1 | 11/2012 | Ohshima |
| 2012/0299626 A1* | 11/2012 | Fujita et al. | 327/115 |
| 2014/0043068 A1* | 2/2014 | Yamazaki et al. | 327/109 |
| 2014/0043093 A1* | 2/2014 | Yamazaki et al. | 327/437 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-210976 A | 8/1993 |
| JP | 05-251705 A | 9/1993 |
| JP | 07-202677 A | 8/1995 |
| JP | 08-264794 A | 10/1996 |
| JP | 11-505377 A | 5/1999 |
| JP | 11-177408 A | 7/1999 |
| JP | 2000-044236 A | 2/2000 |
| JP | 2000-150900 A | 5/2000 |
| JP | 2001-044822 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

(56) References Cited

OTHER PUBLICATIONS

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID'07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

(56) References Cited

OTHER PUBLICATIONS

Kim, S et al., "High-Performance oxide thin film transistors passivated by various gas plasmas," the Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m =3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using Igzo Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

* cited by examiner

SEMICONDUCTOR DEVICE AND METHOD FOR DRIVING SEMICONDUCTOR DEVICE

BACKGROUND OF THE INVENTION

1. Field of the Invention

The disclosed invention relates to semiconductor devices using complementary metal oxide semiconductor (CMOS) circuits.

The semiconductor device in this specification indicates all the devices that can operate by utilizing semiconductor characteristics. For example, such semiconductor devices widely include the following elements: a semiconductor element (including a so-called power device) such as a transistor, a diode and a thyristor, a logic circuit such as an inverter, an integrated circuit such as an image sensor, a memory and a converter, an integrated circuit including the above elements and a display device typified by a liquid crystal display device, and the like.

2. Description of the Related Art

A CMOS circuit is a necessary component for a semiconductor integrated circuit because the CMOS circuit has low power consumption and can operate at high speed and can be highly integrated. However, in recent years, there is a problem of an increase of power consumption in accordance with miniaturization of a MOS transistor. For example, power consumption in a non-operation period is increased because of leakage current of a transistor included in a CMOS circuit.

Patent Document 1 discloses a technique by which a switching transistor is further provided in a CMOS circuit in order to suppress an increase of leakage current.

REFERENCE

[Patent Document 1] Japanese Published Patent Application No. H5-210976

SUMMARY OF THE INVENTION

According to the technique disclosed in Patent Document 1, an increase of power consumption in a non-operation period resulting from an increase of leakage current can be suppressed. However, the increase of power consumption in a CMOS circuit is caused not only in a non-operation period.

An increase of power consumption in a CMOS circuit is also a problem to an operation period. In particular, a shoot-through current at the time of logic inversion of a CMOS circuit is a big cause of an increase of power consumption in an operation period.

In view of the above problem, an object of one embodiment of the disclosed invention is to provide a semiconductor device with lowered power consumption in an operation period. In particular, it is an object to provide a semiconductor device with low power consumption in an operation period achieved by reducing a shoot-through current of a CMOS circuit.

One embodiment of the disclosed invention is a semiconductor device comprising, between a high potential power supply line and a low potential power supply line, a first transistor having a p-channel type; a second transistor having an n-channel type; and a third transistor with low off-state current, and a gate terminal of the first transistor is electrically connected to a gate terminal of the second transistor; a source terminal of the first transistor is electrically connected to the high potential power supply line; a drain terminal of the first transistor is electrically connected to a drain terminal of the second transistor; a source terminal of the second transistor is electrically connected to one of a source terminal and a drain terminal of the third transistor; the other of the source terminal and the drain terminal of the third transistor is electrically connected to the low potential power supply line; and the third transistor is turned off when both the first transistor and the second transistor are in conducting states.

Another embodiment of the disclosed invention is a semiconductor device comprising, between a high potential power supply line and a low potential power supply line, a first transistor having a p-channel type; a second transistor having an n-channel type; and a third transistor with low off-state current, and a gate terminal of the first transistor is electrically connected to a gate terminal of the second transistor; a source terminal of the first transistor is electrically connected to the high potential power supply line; a drain terminal of the first transistor is electrically connected to one of a source terminal and a drain terminal of the third transistor; a drain terminal of the second transistor is electrically connected to the other of the source terminal and the drain terminal of the third transistor; a source terminal of the second transistor is electrically connected to the low potential power supply line; and the third transistor is turned off when both the first transistor and the second transistor are in conducting states.

Another embodiment of the disclosed invention is a semiconductor device comprising, between a high potential power supply line and a low potential power supply line, a first transistor having an p-channel type; a second transistor having an n-channel type; and a third transistor with low off-state current, and a gate terminal of the first transistor is electrically connected to a gate terminal of the second transistor; a source terminal of the first transistor is electrically connected to one of a source terminal and a drain terminal of the third transistor; a drain terminal of the first transistor is electrically connected to a drain terminal of the second transistor; a source terminal of the second transistor is electrically connected to the low potential power supply line; the other of the source terminal and the drain terminal of the third transistor is electrically connected to the high potential power supply line; and the third transistor is turned off when both the first transistor and the second transistor are in conducting states.

Further, the semiconductor device may be structured such that the third transistor is turned off, at least when a voltage applied to the gate terminal of the first transistor and the gate terminal of the second transistor is higher than a potential of the low potential power supply line and lower than a potential of the high potential power supply line Furthermore, the third transistor preferably includes an oxide semiconductor. The first transistor and the second transistor preferably include silicon.

Note that in this specification and the like, the term such as "over" or "below" does not necessarily mean that a component is placed "directly on" or "directly under" another component. For example, the expression "a gate electrode over a gate insulating layer" can include a case where another component is provided between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include a case where plural "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes a case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

In accordance with one embodiment of the disclosed invention, a semiconductor device which consumes lower power in an operation period can be provided. In particular, by reducing an amount of a shoot-through current in a CMOS circuit, a semiconductor device with lowered power consumption in an operation period can be provided.

DETAILED DESCRIPTION OF THE INVENTION

Figure 1A:
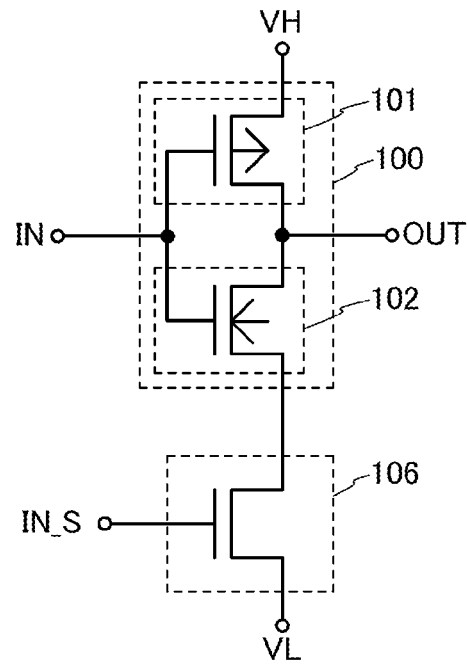
FIG. 1A and FIG. 1B are a circuit diagram and a timing chart of a semiconductor device according to one embodiment of the disclosed invention.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

In this specification, a term "parallel" indicates that the angle formed between two straight lines is from −10° to 10°, and accordingly also includes a case where the angle is from −5° to 5°. In addition, a term "perpendicular" indicates that the angle formed between two straight lines is from 80° to 100°, and accordingly includes a case where the angle is from 85° to 95°.

In this specification, trigonal and rhombohedral crystal systems are included in hexagonal crystal system.

Embodiment 1

In this embodiment, a structure and an operation of a semiconductor device according to one embodiment of the disclosed invention will be described with reference to FIGS. 1A and 1B, FIGS. 2A and 2B, FIGS. 3A and 3B, FIGS. 4A to 4H, FIGS. 5A and 5B, FIGS. 6A to 6C, FIGS. 7A and 7B, and FIGS. 8A and 8B.

FIG. 1A is a circuit diagram of a semiconductor device according to one embodiment of the disclosed invention. The semiconductor device illustrated in FIG. 1A is a semiconductor device that functions as a CMOS inverter. FIG. 1A illustrates a semiconductor device which includes a CMOS inverter circuit 100 including a transistor 101 having a p-channel type (also called a p-channel transistor in this specification) and a transistor 102 having an n-channel type (also called an n-channel transistor in this specification), and a transistor 106 with extremely low off-state current. The semiconductor device is electrically connected to a high potential power supply line at a terminal VH and is electrically connected to a low potential power supply line at a terminal VL.

Specifically, a gate terminal of the transistor 101 is electrically connected to a gate terminal of the transistor 102, a source terminal of the transistor 101 is electrically connected to the high potential power supply line, and a drain terminal of the transistor 101 is electrically connected to a drain terminal of the transistor 102. In addition, a source terminal of the transistor 102 is electrically connected to one of a source terminal and a drain terminal of the transistor 106. Further, the other of the source terminal and the drain terminal of the transistor 106 is electrically connected to the low potential power supply line.

Here, the source terminal of the transistor 101 serves as the terminal VH and the other of the source terminal and the drain terminal of the transistor 106 serves as the terminal VL. In addition, the gate terminals of the transistor 101 and the transistor 102 serve as an input terminal IN of the CMOS inverter circuit 100 and the drain terminals of the transistor 101 and the transistor 102 serve as an output terminal OUT of the CMOS inverter circuit 100. Further, a gate terminal of the transistor 106 serves as a control terminal IN_S.

Here, the high potential power supply line not illustrated in FIG. 1A is given a high potential H and the low potential power supply line not illustrated in FIG. 1A is given a low potential L such as a ground potential (GND), for example.

There are no particular limitations on semiconductor materials used for the transistor 101 and the transistor 102, but materials which have forbidden bands different from a semiconductor material used for the transistor 106 with extremely low off-state current are preferred. Examples of such semiconductor materials include silicon, germanium, silicon germanium, gallium arsenide, and the like, and a single crystal semiconductor is preferably used. In terms of increasing the operation speed of the CMOS circuit, it is preferable to use, for example, a transistor with high switching rate such as a transistor including single crystal silicon.

The transistor 106 is preferably a transistor with extremely low off-state current. The transistor with extremely low off-state current preferably includes, in a channel formation region, a wide band gap semiconductor having a wider band gap and lower intrinsic carrier density than single crystal silicon. For example, the band gap of the wide band gap semiconductor may be more than 1.1 eV, preferably 2.5 eV or more and 4 eV or less, still preferably 3 eV or more and 3.8 eV or less. For example, as the wide band gap semiconductor, a compound semiconductor such as silicon carbide (SiC) or gallium nitride (GaN), an oxide semiconductor formed using metal oxide such as an In—Ga—Zn—O based material, or the like can be used. Alternatively, because a transistor including amorphous silicon, microcrystalline silicon, or the like can have lower off-state current than a transistor including single crystal silicon, the transistor 106 may employ amorphous silicon, microcrystalline silicon, or the like.

The band gap of single crystal silicon is approximately 1.1 eV, and even in a state where there is no carrier caused by a donor or an acceptor (i.e., even in the case of an intrinsic semiconductor), the concentration of thermally excited carriers is approximately $1 \times 10^{11}$ cm$^{-3}$. The band gap of an In—Ga—Zn—O-based oxide semiconductor which is the wide band gap semiconductor is approximately 3.2 eV and the concentration of thermally excited carriers is approximately $1 \times 10^{-7}$ cm$^{-3}$. The off-state resistance (referred to as a resistance between a source and a drain of a transistor in an off state) of a transistor is inversely proportional to the concentration of thermally excited carriers in a channel formation region. Accordingly, the resistivity of an In—Ga—Zn—O-based oxide semiconductor in an off state is 18 orders of magnitude higher than that of single crystal silicon.

By using such a wide band gap semiconductor for the transistor 106, for example, off-state current (per unit channel width (1 µm), here) at room temperature (25° C.) is 100 zA (1 zA (zeptoampere) is $1 \times 10^{-21}$ A) or lower, preferably 10 zA or lower.

In this embodiment, as the transistor 106 with extremely low off-state current, a transistor including an oxide semiconductor is used.

Note that in the description of the semiconductor device illustrated in FIG. 1A, the transistor 106 is an n-channel transistor; however, a p-channel transistor may be used as appropriate. In such a case, a potential supplied to a gate electrode is inverted as appropriate.

Here, shoot-through current generated in a CMOS inverter circuit 10 including a transistor 11 and a transistor 12 will be described, using the conventional CMOS inverter circuit 10 illustrated in FIG. 2A as an example.

Figure 2A:
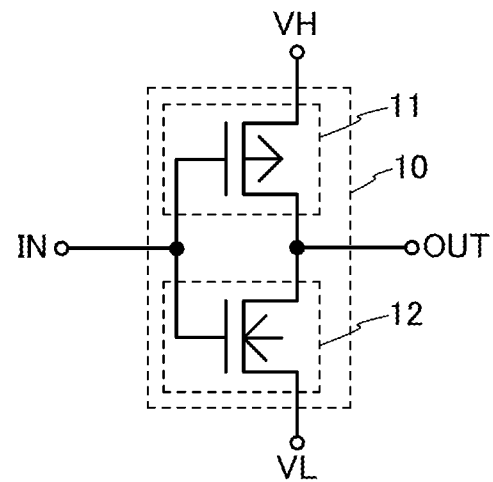
FIGS. 2A and 2B are schematic diagrams illustrating electric characteristics of a part of a semiconductor device.

The CMOS inverter circuit 10 illustrated in FIG. 2A is similar to the CMOS inverter circuit 100 illustrated in FIG. 1A, and the p-channel transistor 11 and the n-channel transistor 12 are similar to the transistor 101 and the transistor 102, respectively. In other words, the CMOS inverter circuit 10 illustrated in FIG. 2A is different from the semiconductor device illustrated in FIG. 1A in that the transistor 106 is not provided, and the other parts in FIG. 2A are similar to those in FIG. 1A.

Figure 2B:
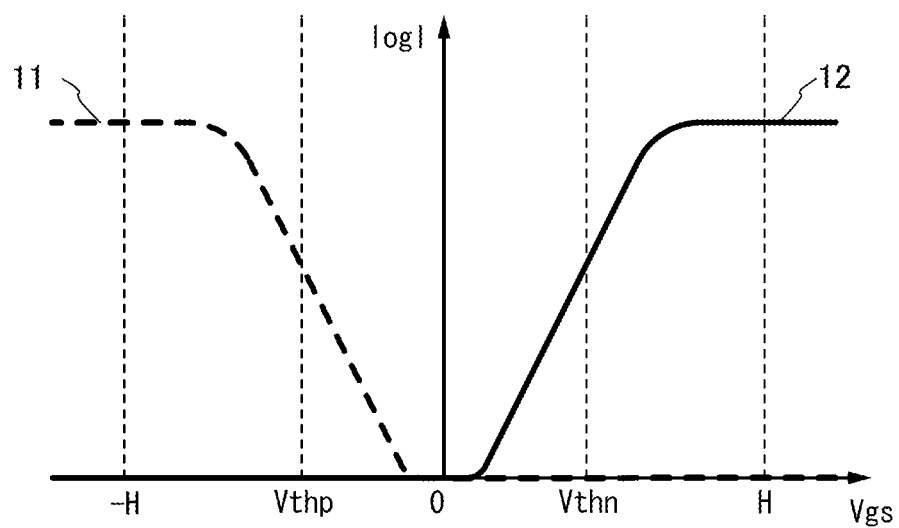

FIG. 2B is a schematic diagram of characteristics of the transistor 11 and the transistor 12. In FIG. 2B, the vertical axis represents current I flowing through the transistor 11 and the transistor 12 on a logarithmic scale, and the horizontal axis represents a potential difference Vgs between the gate and the source in each of the transistors 11 and 12. In addition, in FIG. 2B, the characteristics of the p-channel transistor 11 are shown by a dotted line and the characteristics of the n-channel transistor 12 are shown by a solid line.

As illustrated in FIG. 2B, the transistor 11 is turned on when the potential difference Vgs reaches the threshold voltage Vthp or lower, and is brought into a full on state at around –H (V) or lower. In addition, the transistor 11 is turned off when the potential difference Vgs reaches the threshold voltage Vthp or higher, and is brought into a full off state at around 0 V or higher. Further, the transistor 12 is turned off when the potential difference Vgs reaches the threshold voltage Vthn or lower, and is brought into a full off state at around 0 V or lower. In addition, the transistor 12 is turned on when the potential difference Vgs reaches the threshold voltage Vthn or higher, and is brought into a full on state at around H (V) or higher.

Here, in the CMOS inverter circuit 10, when both the transistor 11 and the transistor 12 are in an on state at the same time, or when the both are in an off state at the same time but a relatively large amount of current flows (e.g., weak inversion region or the like), the terminal VH to which a high potential H is given and the terminal VL to which a low potential L is given are short-circuited, which leads to generation of shoot-through current.

Next, with reference to FIGS. 3A and 3B, FIGS. 4A to 4H, and FIGS. 5A and 5B, generation of shoot-through current depending on the voltage applied to the input terminal IN in the CMOS inverter circuit 10 will be described.

Figure 3A:
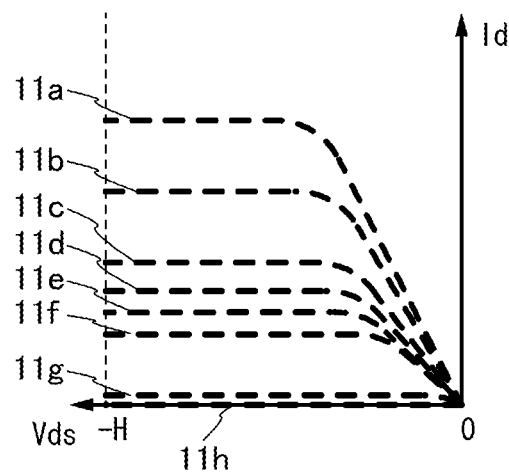
FIGS. 3A and 3B are schematic diagrams illustrating electric characteristics of the part of the semiconductor device.
Figure 3B:
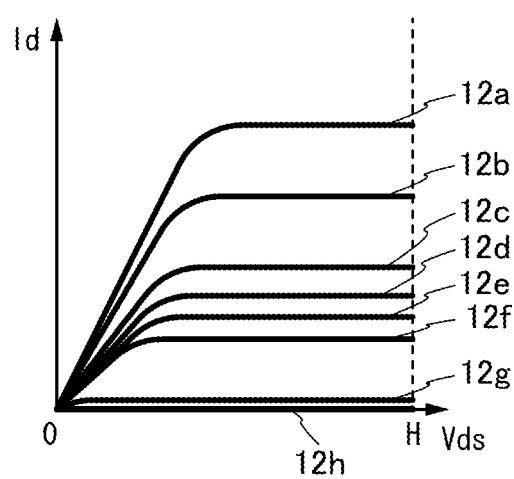

FIG. 3A is a schematic view of Id-Vds characteristics of the p-channel transistor 11, and FIG. 3B is a schematic view of Id-Vds characteristics of the n-channel transistor 12. In each of FIG. 3A and FIG. 3B, the vertical axis represents the current Id flowing through the transistor 11 and the transistor 12, and the horizontal axis represents the potential difference Vds between the source and the drain of each of the transistor 11 and the transistor 12.

In FIG. 3A, the dotted line 11a shows transistor characteristics when the potential difference Vgs is –H (V); the dotted line 11b shows transistor characteristics when the potential difference Vgs is –4H/5 (V); the dotted line 11c shows transistor characteristics when the potential difference Vgs is –3H/5 (V); the dotted line 11d shows transistor characteristics when the potential difference Vgs is –8H/15 (V); the dotted line 11e shows transistor characteristics when the potential difference Vgs is –7H/15 (V); the dotted line 11f shows transistor characteristics when the potential difference Vgs is –2H/5 (V); the dotted line 11g shows transistor characteristics when the potential difference Vgs is –H/5 (V); and the dotted line 11h shows transistor characteristics when the potential difference Vgs is 0 V.

In addition, in FIG. 3B, the solid line 12a shows transistor characteristics when the potential difference Vgs is H (V); the solid line 12b shows transistor characteristics when the potential difference Vgs is 4H/5 (V); the solid line 12c shows transistor characteristics when the potential difference Vgs is 3H/5 (V); the solid line 12d shows transistor characteristics when the potential difference Vgs is 8H/15 (V); the solid line 12e shows transistor characteristics when the potential difference Vgs is 7H/15 (V); the solid line 12f shows transistor characteristics when the potential difference Vgs is 2H/5 (V); the solid line 12g shows transistor characteristics when the potential difference Vgs is H/5 (V); and the solid line 12h shows transistor characteristics when the potential difference Vgs is 0 V.

Here, the potential difference Vgs and the potential difference Vds of the transistor 11 are represented by the potential difference Vgsp and the potential difference Vdsp respectively, and the potential difference Vgs and the potential difference Vds of the transistor 12 are represented by the potential difference Vgsn and potential difference Vdsn respectively. The potential difference Vgsp, the potential difference Vdsp, the potential difference Vgsn, and the potential difference Vdsn are represented by Vgsn=Vin (1), Vgsp=Vin−H (2), Vdsn=Vout (3), and Vdsp=Vout−H (4) respectively, using the potential Vin of the input terminal IN, the potential Vout of the output terminal OUT, and the potential H of the terminal VH of the CMOS inverter circuit 10 illustrated in FIG. 2A. Note that the potential of the terminal VL is 0 V.

According to the expressions (1) and (2), Vgsn and Vgsp can be represented by using Vin, and thus in the CMOS inverter circuit 10, for example, when Vin is equal to H (V) (Vin=H (V)), the transistor 11 exhibits the characteristics shown by the dotted line 11h, and the transistor 12 exhibits the characteristics shown by the solid line 12a. According to the expressions (3) and (4), Vdsn and Vdsp can be represented by using Vout, and thus in the CMOS inverter circuit 10, the schematic views of FIG. 3A and FIG. 3B can be shown together to be overlapped, with Vout on the horizontal axis, as in FIGS. 4A to 4H.

FIGS. 4A to 4H are schematic views showing Id-Vds characteristics of the transistor 11 and the transistor 12 in the CMOS inverter circuit 10 in the cases of Vin=H (V), 4H/5 (V), 3H/5 (V), 8H/15 (V), 7H/15 (V), 2H/5 (V), HIS (V), and 0 (V). In each of FIGS. 4A to 4H, the vertical axis represents current Id flowing through the transistor 11 and the transistor 12, and the horizontal axis represents the potential Vout of the output terminal.

Figure 4A:
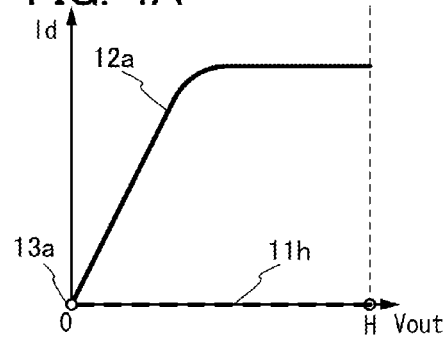
FIGS. 4A to 4H are schematic diagrams illustrating electric characteristics of the part of the semiconductor device.
Figure 4E:
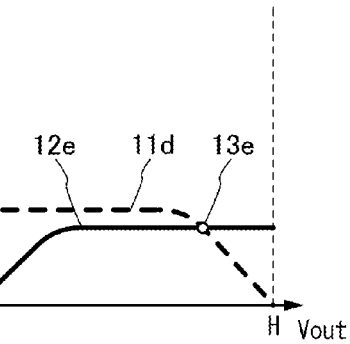

As described above, at the time of Vin=H (V), Vgsp=0 V and Vgsn=H (V) are obtained, and thus, in FIG. 4A, the characteristics of the transistor 11 and the transistor 12 are shown by the dotted line 11h and the solid line 12a. Here, in the CMOS inverter circuit 10, because the current Id and the potential Vout of the transistor 11 are equal to those of the transistor 12, Id and Vout at the time of Vin=H (V) can be obtained from an intersection point 13a of the dotted line 11h and the solid line 12a.

Figure 4B:
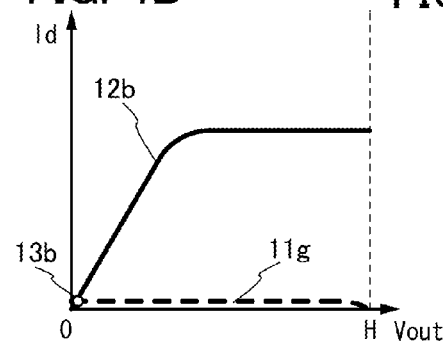
Figure 4F:
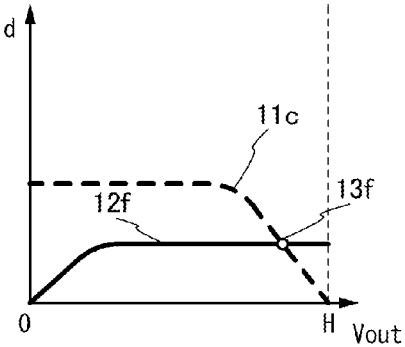
Figure 4C:
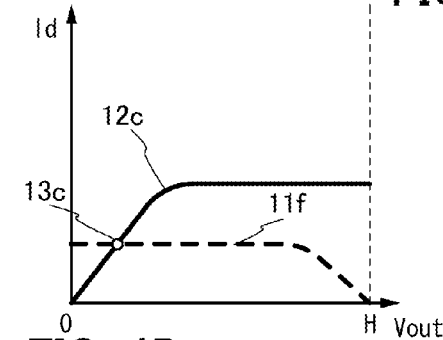
Figure 4G:
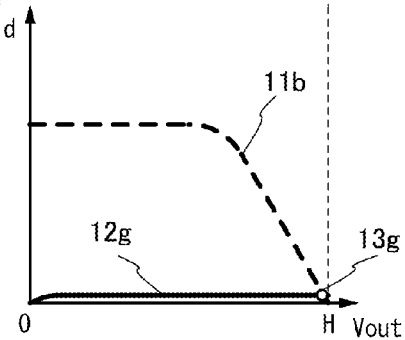
Figure 4D:
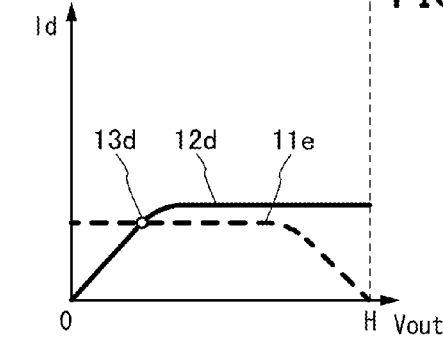
Figure 4H:
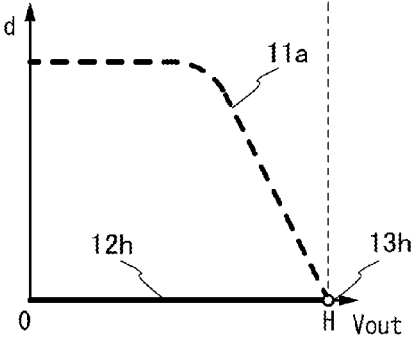

In FIG. 4B, because of Vin=4H/5 (V), the dotted line 11g and the solid line 12b are obtained, and from an intersection point 13b of the dotted line 11g and the solid line 12b, Id and Vout at the time of Vin=4H/5 (V) can be obtained. Below, in a similar manner, based on an intersection point 13c in FIG. 4C, an intersection point 13d in FIG. 4D, an intersection point 13e in FIG. 4E, an intersection point 13f in FIG. 4F, an intersection point 13g in FIG. 4G and an intersection point 13h in FIG. 4H, Id and Vout corresponding to Vin in the respective cases can be obtained.

Figure 5A:
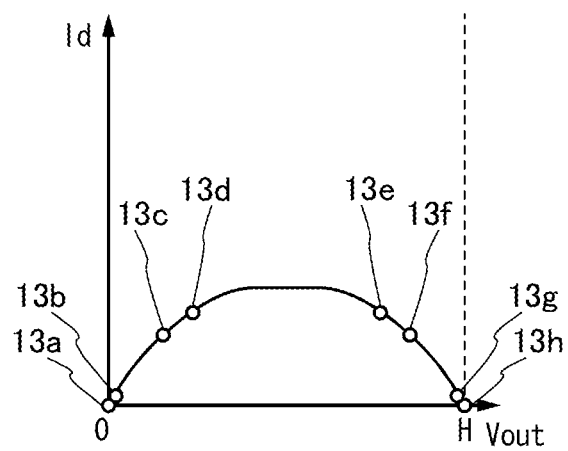
FIGS. 5A and 5B are schematic diagrams illustrating electric characteristics of the part of the semiconductor device.

In the schematic view of FIG. 5A, the intersection points 13a to 13h shown in FIG. 4A to FIG. 4H are plotted and connected with a smooth curved line. Further, the intersection points 13a to 13h shown in FIG. 5A have Vin respective thereto, and are plotted with the potential Vin of the input terminal on the horizontal axis, which are shown in the schematic view of FIG. 5B.

Figure 5B:
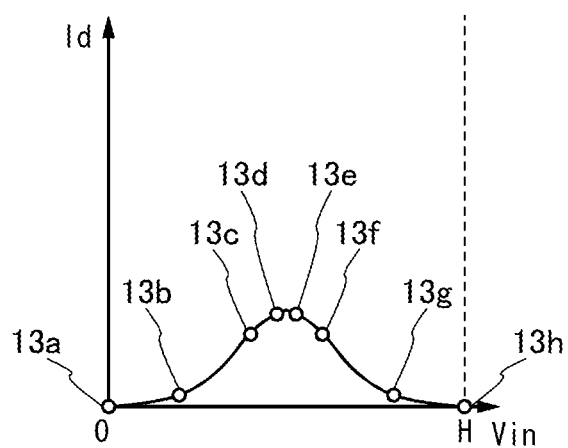

As shown in the schematic view of FIG. 5B, the current Id corresponding to the potential input into the input terminal IN in the CMOS inverter circuit 10 can be seen. FIG. 5B shows that the current Id flows in the CMOS inverter circuit 10 when the potential Vin of the input terminal is shifted between 0 (V) and H (V). In other words, it is considered that the terminal VH and the terminal VL are short-circuited, which leads to generation of shoot-through current.

Here, both the transistor 11 and the transistor 12 are in an on state or an off state but a relatively large amount of current flows (hereinafter, this state is called conducting state). In this manner, when both the transistor 11 and the transistor 12 are in conducting states, the terminal VH to which a high potential H is given and the terminal VL to which a low potential L is given are short-circuited, which leads to generation of shoot-through current.

In particular, when the potential Vin is from the threshold voltage of the transistor 12 to a voltage obtained by adding H (V) to the threshold voltage of the transistor 11, for example, with the potential Vin at around H/2 (V), the amount of the current Id flowing through the transistor 11 and the transistor 12 is large, so that the amount of generated shoot-through current is also large.

Thereupon, in the semiconductor device described in this embodiment, as illustrated in FIG. 1A, the transistor 106 is provided in addition to the CMOS inverter circuit 100, and when the transistor 101 and the transistor 102 are both in the conducting states described above, the transistor 106 is turned off, thereby suppressing the generation of the shoot-through current. For example, when the potential Vin is from the low potential L of the low potential power supply line to the high potential H of the high potential power supply line, the transistor 106 is turned off. In particular, when the potential Vin is in the vicinity of the average of the low potential L and the high potential H, the transistor 106 is turned off, so that the shoot-through current can be reduced successfully.

As described above, as the transistor 106, a transistor with extremely low off-state current, for example, a transistor using an oxide semiconductor is used, so that a shoot-through current can be reduced successfully.

Figure 1B:
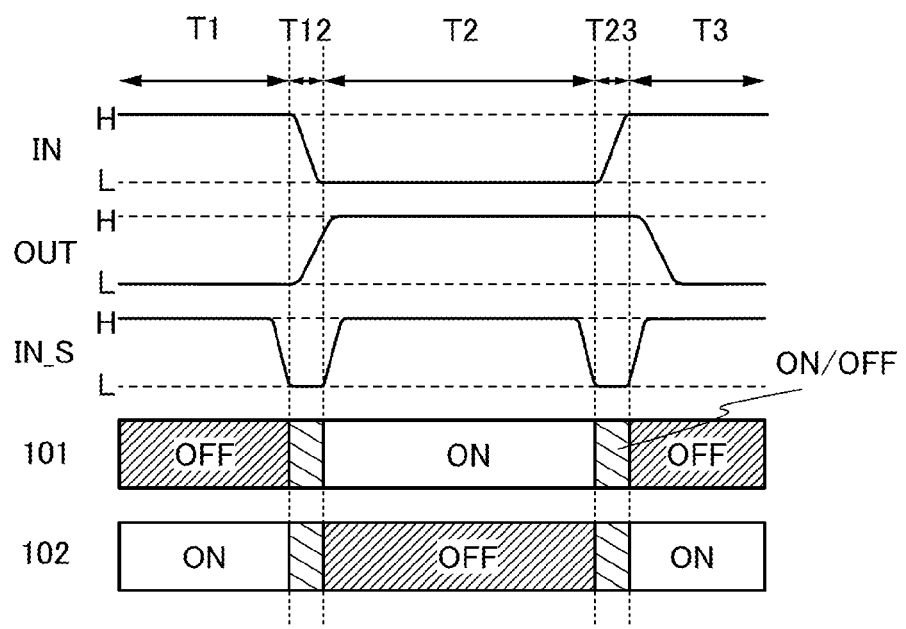

Here, an operation of the semiconductor device illustrated in FIG. 1A will be described with reference to the timing chart of FIG. 1B. The timing chart of FIG. 1B shows the potentials of the input terminal IN, the output terminal OUT, and the control terminal IN_S in a period T1, a transitional period T12, a period T2, a transitional period T23, and a period T3, and ON/OFF of the transistor 101 and the transistor 102. In this case, the period T1 is a period in which a high potential H is input, the transitional period T12 is a period in which the potential of the input terminal IN is shifted from the high potential H to a low potential L, the period T2 is a period in which the low potential L is input, the transitional period T23 is a period in which the potential of the input terminal IN is shifted from the low potential L to the high potential H, and the period T3 is a period in which the high potential H is input. Note that the references noted on the left side of the timing chart, IN, OUT, IN_S, 101, and 102, correspond to the input terminal IN, the output terminal OUT, the control terminal IN_S, the transistor 101 and the transistor 102, respectively. In addition, in the timing chart of the transistor 101 and the transistor 102, ON denotes the period in which each transistor is in an on state, OFF denotes the period in which each transistor is in an off state, and ON/OFF denotes the period in which an on state and an off state are both included.

In the period T1, the high potential H is input into the input terminal IN and the control terminal IN_S, so that the transistor 101 is turned off, the transistor 102 is turned on, and the transistor 106 is turned on. In this manner, the low potential L is output from the output terminal OUT.

Next, in the transitional period T12, the potential of the input terminal IN is shifted from the high potential H to the low potential L, and thus the transistor 101 is shifted from the off state to an on state and the transistor 102 is shifted from the on state to an off state. Thus, the potential of the output terminal OUT is shifted from the low potential L to the high potential H. At this time, a low potential L is input into the control terminal IN_S, so that the transistor 106 is turned off.

As described above, the transitional period T12 includes a period where both the transistor 101 and the transistor 102 are in conducting states. For this reason, in the semiconductor device described in this embodiment, the transistor 106 is turned off in the transitional period T12, so that the shoot-through current can be reduced. In the timing chart of FIG. 1B, in the transitional period T12, in order to fully turn off the transistor 106, the potential of the control terminal IN_S begins to be lowered from the high potential H before the transitional period T12 and is set to the low potential L when the transition period T12 starts. Further, when the transitional period T12 finishes, the potential of the control terminal IN_S is raised from the low potential L and after the period T2 starts, the potential of the control terminal IN_S is set to the high potential H. In this manner, the transistor 106 can be turned off when the potential of the input terminal IN is shifted from the high potential H of the high potential power supply line to the low potential L of the low potential power supply line.

In the transitional period T12, the timing of turning off the transistor 106 is not limited to the above. For example, the transistor 106 may be turned off when the potential of the input terminal IN is lower than or equal to a potential obtained by adding H (V) to the threshold voltage of the transistor 101, and higher than or equal to the threshold voltage of the transistor 102. Alternatively, the transistor 106 may be turned off when the potential of the input terminal IN is lower than or equal to a potential allowing the transistor 101 to be in a weak inversion region, and higher than or equal to a potential allowing the transistor 102 to be in a weak inversion region. Alternatively, the transistor 106 may be turned off when the potential of the input terminal IN is in the vicinity of the average of the low potential L and the high potential H. In this manner, when the amount of shoot-through current is relatively large, the transistor 106 is turned off, thereby reducing the shoot-through current sufficiently.

In the period T2, the low potential L is input into the input terminal IN, so that the transistor 101 is turned on and the transistor 102 is turned off. In this manner, the high potential H is output from the output terminal OUT. In the timing chart of FIG. 1B, in the period T2, the high potential H is input into the control terminal IN_S to turn on the transistor 106, but this is not a limiting example, and the transistor 106 may be turned off in the period T2. In other words, the transistor 106 may be turned off in synchronization with the timing of turning off the transistor 102.

In the transitional period T23, the potential of the input terminal IN is shifted from the low potential L to the high potential H, so that the transistor 101 is shifted from the on state to the off state and the transistor 102 is shifted from the off state to the on state. At this time, the low potential L is input into the control terminal IN_S, thereby turning off the transistor 106. In this manner, in the second transitional period T23, an electrical path between the low potential power supply line L and the output terminal OUT is in a non-conducting state, so that the potential of the output terminal OUT is kept at the high potential H.

As in the transitional period T12, the transitional period T23 includes a period where both the transistor 101 and the transistor 102 are in conducting states. For this reason, in the semiconductor device described in this embodiment, the transistor 106 is turned off in the transitional period T23, so that the shoot-through current can be reduced. In the timing chart of FIG. 1B, in the transitional period T23, in order to fully turn off the transistor 106, the potential of the control terminal IN_S begins to be lowered from the high potential H before the transitional period T23 and is set to the low potential L when the transition period T23 starts. Further, when the transitional period T23 finishes, the potential of the control terminal IN_S is raised from the low potential L and after the period T3 starts, the potential of the control terminal IN_S is set to the high potential H. In this manner, the transistor 106 can be turned off when the potential of the input terminal IN is shifted from the low potential L of the low potential power supply line to the high potential H of the high potential power supply line.

In a transitional period T23, the timing of turning off the transistor 106 is not limited to the above. For example, the transistor 106 may be turned off when the potential of the input terminal IN is lower than or equal to a potential obtained by adding H (V) to the threshold voltage of the transistor 101, and higher than or equal to the threshold voltage of the transistor 102. Alternatively, the transistor 106 may be turned off when the potential of the input terminal IN is lower than or equal to a potential allowing the transistor 101 to be in a weak inversion region, and higher than or equal to a potential allowing the transistor 102 to be in a weak inversion region. Alternatively, the transistor 106 may be turned off when the potential of the input terminal IN is in the vicinity of the average of the low potential L and the high potential H. In this manner, when the amount of shoot-through current is relatively large, the transistor 106 is turned off, thereby reducing the shoot-through current sufficiently.

In the period T3, the high potential H is input into the input terminal IN and the control terminal IN_S so that the transistor 101 is turned off, the transistor 102 is turned on, and the transistor 106 is turned on. Thus, the low potential L is output from the output terminal OUT. Here, the potential of the output terminal OUT begins to be reduced when the transistor 106 is brought into the on state, and thus there is a time lag after the potential of the input terminal IN is set to the high potential H and before the potential of the output terminal OUT reaches the low potential L.

As described above, the transistor 106 is provided and the transistor 106 is turned off when the transistor 101 and the transistor 102 are in conducting states, thereby reducing shoot-through current generated at the time of logic inversion of the CMOS inverter circuit 100. In this manner, the power consumption in an operation period of the semiconductor device described in this embodiment can be reduced.

The semiconductor device according to the present invention is not limited to the semiconductor device illustrated in FIG. 1A. Hereinafter, with reference to FIGS. 6A to 6C, semiconductor devices having different structures from the semiconductor device illustrated in FIG. 1A will be described. Note that the semiconductor devices illustrated in FIGS. 6A to 6C serve as CMOS inverter circuits, similarly to the semiconductor device illustrated in FIG. 1A. Accordingly, the same references are applied to a CMOS inverter circuit 100, a transistor 101, a transistor 102, and a transistor 106.

Figure 6A:
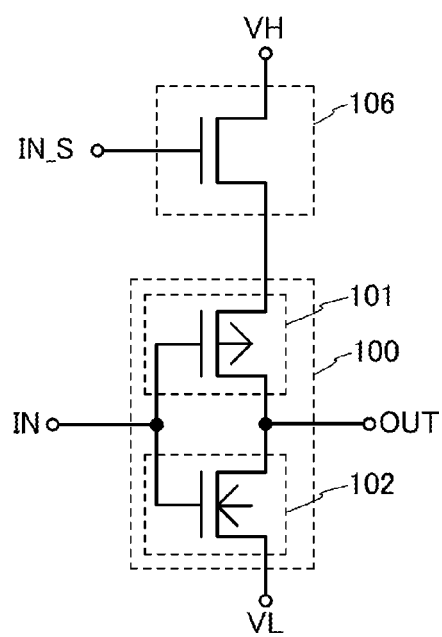
FIGS. 6A to 6C are each a circuit diagram of a semiconductor device according to one embodiment of the disclosed invention.

In the semiconductor device illustrated in FIG. 6A, one of a source terminal and a drain terminal of the transistor 106 is electrically connected to a high potential power supply line, while the other of the source terminal and the drain terminal of the transistor 106 is electrically connected to a source terminal of the transistor 101. In addition, a gate terminal of the transistor 101 is electrically connected to a gate terminal of the transistor 102, and a drain terminal of the transistor 101 is electrically connected to a drain terminal of the transistor 102. A source terminal of the transistor 102 is electrically connected to a low potential power supply line.

In other words, the semiconductor device illustrated in FIG. 6A is different from the semiconductor device illustrated in FIG. 1A in that the transistor 106 is provided between the high potential power supply line and the transistor 101. For other parts, the description of the semiconductor device illustrated in FIG. 1A can be referred to.

Figure 6B:
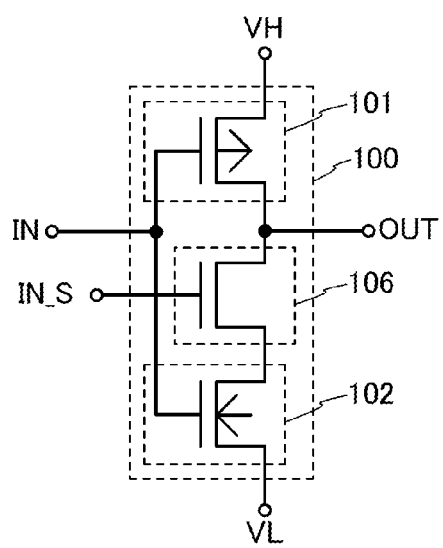

In the semiconductor device illustrated in FIG. 6B, a gate terminal of a transistor 101 is electrically connected to a gate terminal of a transistor 102, a source terminal of the transistor 101 is electrically connected to a high potential power supply line, and a drain terminal of the transistor 101 is electrically connected to one of a source terminal and a drain terminal of a transistor 106. In addition, a source terminal of a transistor 102 is electrically connected to a low potential power supply line, and a drain terminal of the transistor 102 is electrically connected to the other of the source terminal and the drain terminal of the transistor 106. Note that in the semiconductor device illustrated in FIG. 6B, the drain terminal of the transistor 101 and one of the source terminal and the drain terminal of the transistor 106 serve as an output terminal OUT.

In other words, the semiconductor device illustrated in FIG. 6B is different from the semiconductor device illustrated in FIG. 1A in that the transistor 106 is provided between the transistor 101 and the transistor 102. For other parts, the description of the semiconductor device illustrated in FIG. 1A can be referred to.

Figure 6C:
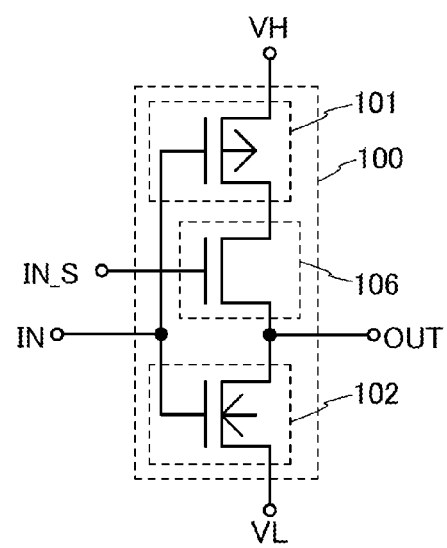

In addition, the semiconductor device illustrated in FIG. 6C is different from that the semiconductor device illustrated in FIG. 6B in that the other of the source terminal and the drain terminal of the transistor 106 and the drain terminal of the transistor 102 serve as an output terminal OUT. For other parts, the description of the semiconductor device illustrated in FIG. 6B can be referred to.

As illustrated in FIG. 1A and FIGS. 6A to 6C, the source terminal and the drain terminal of the transistor 106 are connected between the high potential power supply line and the low potential power supply line so that the transistor 106 is connected in series with the transistor 101 and the transistor 102. As described above, the transistor 106 is provided and the transistor 106 is turned off when the transistor 101 and the transistor 102 are in conducting states, thereby reducing shoot-through current generated at the time of logic inversion of the CMOS inverter circuit 100.

Further, the semiconductor device included in the CMOS inverter circuit has been described above; however, the semiconductor device according to the present invention is not limited to the above. A semiconductor device using a CMOS circuit, which is different from the CMOS inverter circuit, will be described below with reference to FIGS. 7A and 7B and FIGS. 8A and 8B.

Figure 7A:
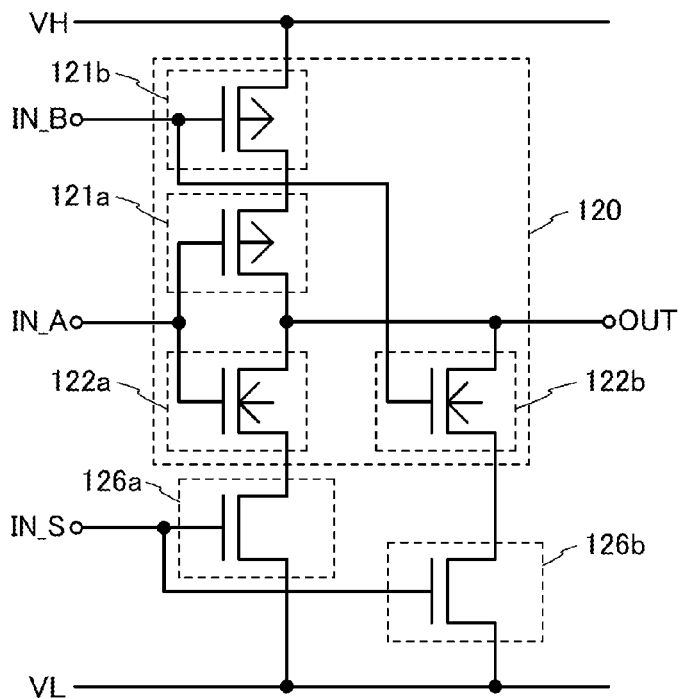
FIGS. 7A and 7B are each a circuit diagram of a semiconductor device according to one embodiment of the disclosed invention.
Figure 7B:
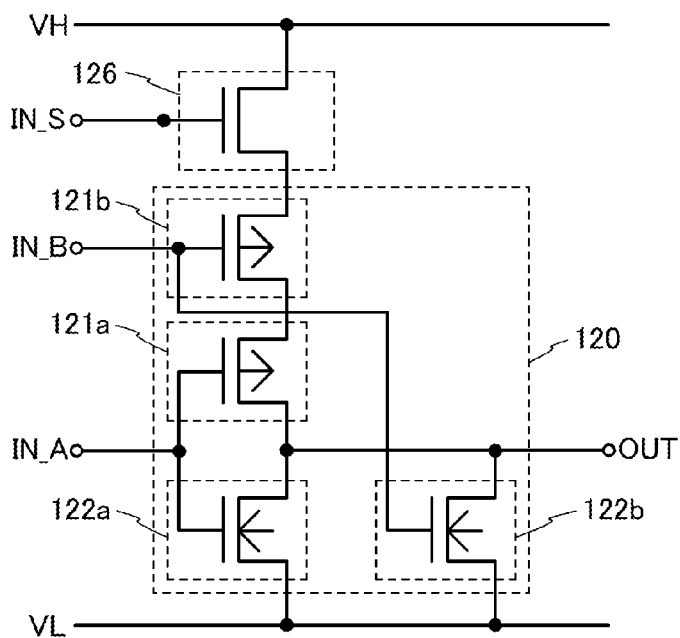

FIG. 7A and FIG. 7B illustrate examples of semiconductor devices functioning as NOR circuits. The semiconductor device illustrated in FIG. 7A includes a NOR circuit 120 including a p-channel transistor 121a, a p-channel transistor 121b, an n-channel transistor 122a, and an n-channel transistor 122b; a transistor 126a with extremely low off-state current; and a transistor 126b with extremely low off-state current. In addition, a high potential power supply line VH to which a high potential H is given and a low potential power supply line VL to which a low potential L such as a ground potential (GND) is given are provided.

Here, the transistor 121a and the transistor 121b; the transistor 122a and the transistor 122b; and the transistor 126a and the transistor 126b correspond to the transistor 101; the transistor 102; and the transistor 106, respectively, and can have similar structures to the respective transistors.

Specifically, a gate terminal of the transistor 121b is electrically connected to a gate terminal of the transistor 122b, a source terminal of the transistor 121b is electrically connected to the high potential power supply line VH, a drain terminal of the transistor 121b is electrically connected to a source terminal of the transistor 121a. In addition, a gate terminal of the transistor 121a is electrically connected to a gate terminal of the transistor 122a, a drain terminal of the transistor 121a is electrically connected to a drain terminal of the transistor 122a and a drain terminal of the transistor 122b. In addition, a source terminal of the transistor 122a is electrically connected to one of a source terminal and a drain terminal of the transistor 126a. In addition, a source terminal of the transistor 122b is electrically connected to one of a source terminal and a drain terminal of the transistor 126b. In addition, a gate terminal of the transistor 126a is electrically connected to a gate terminal of the transistor 126b, and the other of the source terminal and the drain terminal of the transistor 126a is electrically connected to the low potential power supply line VL. Further, the other of the source terminal and the drain terminal of the transistor 126b is electrically connected to the low potential power supply line VL.

Here, the gate terminal of the transistor 121a and the gate terminal of the transistor 122a serve as an input terminal IN_A of the NOR circuit 120. In addition, the gate terminal of the transistor 121b and the gate terminal of the transistor 122b serve as an input terminal IN_B of the NOR circuit 120. Further, the drain terminal of the transistor 121a, the drain terminal of the transistor 122a, and the drain terminal of the transistor 122b serve as the output terminal OUT of the NOR circuit 120. In addition, the gate terminal of the transistor 126a and the gate terminal of the transistor 126b serve as a control terminal IN_S.

As described above, by provision of the transistor 126a and the transistor 126b between the NOR circuit 120 and the low potential power supply line VL, the power consumption in an operation period can be reduced. When the potential input into the input terminal IN_A or the input terminal N_B is inverted so that the transistor 121b, the transistor 121a, and the transistor 122a are brought into conducting states, the transistor 126a is turned off. In this manner, generation of a shoot-through current flowing through the transistor 121b, the transistor 121a, and the transistor 122a can be suppressed. When the potential input into the input terminal IN_A or the input terminal N_B is inverted so that the transistor 121b, the transistor 121a, and the transistor 122b are brought into conducting states, the transistor 126b is turned off. In this manner, generation of a shoot-through current flowing through the transistor 121b, the transistor 121a, and the transistor 122b can be suppressed.

FIG. 7B illustrates an example of a semiconductor device serving as a NOR circuit which has a different structure from that illustrated in FIG. 7A. The semiconductor device illustrated in FIG. 7B uses one transistor 126, whereas the semiconductor device illustrated in FIG. 7A uses two transistors, the transistor 126a and the transistor 126b.

In addition, in the semiconductor device illustrated in FIG. 7B, one of a source terminal and a drain terminal of the transistor 126 is electrically connected to a high potential power supply line VH, and the other of the source terminal and the drain terminal of the transistor 126 is electrically connected to a source terminal of a transistor 121b. In addition, a gate terminal of the transistor 121b is electrically connected to a gate terminal of a transistor 122b, and a drain terminal of the transistor 121b is electrically connected to a source terminal of a transistor 121a. In addition, a gate terminal of the transistor 121a is electrically connected to a gate terminal of the transistor 122a, and a drain terminal of the transistor 121a is electrically connected to a drain terminal of the transistor 122a and a drain terminal of the transistor 122b. A source terminal of the transistor 122a is electrically connected to a low potential power supply line VL and a source terminal of the transistor 122b is electrically connected to the low potential power supply line VL.

In other words, the semiconductor device illustrated in FIG. 7B is different from the semiconductor device illustrated in FIG. 7A in that the transistor 126 is provided between the high potential power supply line VH and the transistor 121b. For other parts, the description of the semiconductor device illustrated in FIG. 7A can be referred to.

As described above, by provision of the transistor 126 between the NOR circuit 120 and the high potential power supply line VH, the power consumption in an operation period can be reduced. When the potential input into the input terminal IN_A or the input terminal IN_B is inverted so that the transistor 121b, the transistor 121a, and the transistor 122a are brought into conducting states, the transistor 126 is turned off. In this manner, generation of a shoot-through current flowing through the transistor 121b, the transistor 121a, and the transistor 122a can be suppressed. In addition, when the potential input into the input terminal IN_A or the input terminal IN_B is inverted so that the transistor 121b, the transistor 121a, and the transistor 122b are brought into conducting states, the transistor 126 is turned off. In this manner, generation of a shoot-through current flowing through the transistor 121b, the transistor 121a, and the transistor 122b can be suppressed.

Figure 8A:
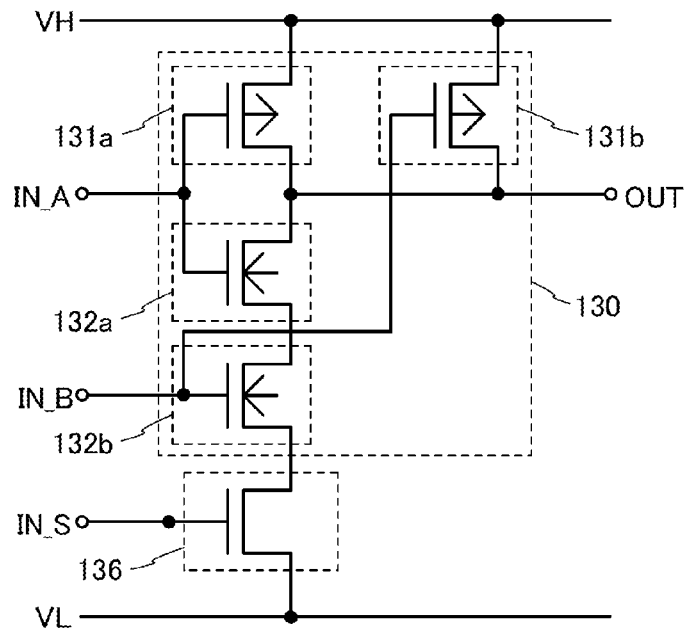
FIGS. 8A and 8B are each a circuit diagram of a semiconductor device according to one embodiment of the disclosed invention.
Figure 8B:
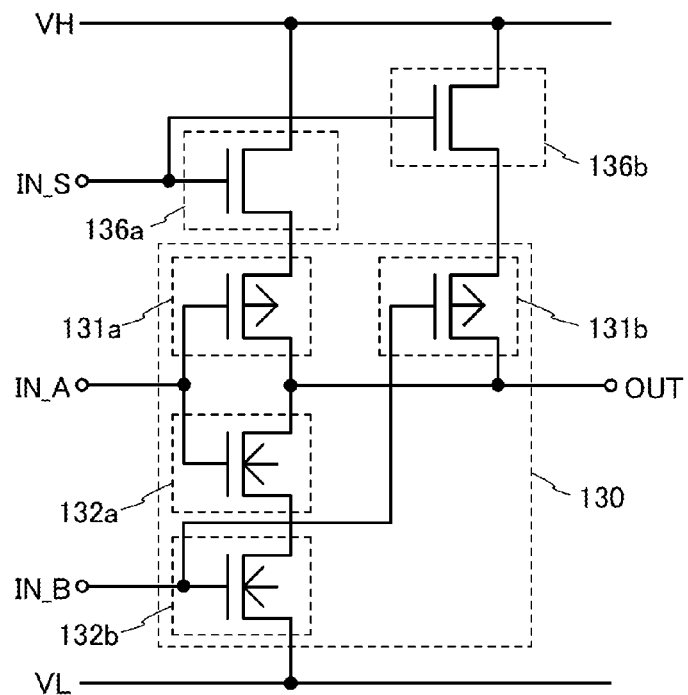

FIG. 8A and FIG. 8B illustrate examples of semiconductor devices serving as NAND circuits. The semiconductor device illustrated in FIG. 8A includes a NAND circuit 130 including a p-channel transistor 131a, a p-channel transistor 131b, an n-channel transistor 132a and an n-channel transistor 132b, and a transistor 136 with extremely low off-state current. In addition, a high potential power supply line VH to which a high potential H is given and a low potential power supply line VL to which a low potential L such as a ground potential (GND) is given are provided.

Here, the transistor 131a and the transistor 131b; the transistor 132a and the transistor 132b; and the transistor 136a and the transistor 136b correspond to the transistor 101; the transistor 102; and the transistor 106; respectively, and can have similar structures to the respective transistors.

Specifically, a gate terminal of the transistor 131a is electrically connected to a gate terminal of the transistor 132a, a source terminal of the transistor 131a is electrically connected to the high potential power supply line VH, and a drain terminal of the transistor 131a is electrically connected to a drain terminal of the transistor 132a and a drain terminal of the transistor 131b. In addition, a gate terminal of the transistor 131b is electrically connected to a gate terminal of the transistor 132b, and a source terminal of the transistor 131b is electrically connected to the high potential power supply line VH. In addition, a source terminal of the transistor 132a is electrically connected to a drain terminal of the transistor 132b. In addition, a source terminal of the transistor 132b is electrically connected to one of a source terminal and a drain terminal of the transistor 136. In addition, the other of the source terminal and the drain terminal of the transistor 136 is electrically connected to the low potential power supply line VL.

Here, the gate terminal of the transistor 131a and the gate terminal of the transistor 132a serve as an input terminal IN_A of the NAND circuit 130. In addition, the gate terminal of the transistor 131b and the gate terminal of the transistor 132b serve as an input terminal IN_B of the NAND circuit 130. Further, the drain terminal of the transistor 131a, the drain terminal of the transistor 131b, and the drain terminal of the transistor 132a serve as an output terminal OUT of the NAND circuit 130. In addition, the gate terminal of the transistor 136 serves as a control terminal IN_S.

As described above, by provision of the transistor 136 between the NAND circuit 130 and the low potential power supply line VL, the power consumption in an operation period can be reduced. When the potential input into the input terminal IN_A or the input terminal IN_B is inverted so that the transistor 131a, the transistor 132a, and the transistor 132b are brought into conducting states, the transistor 136 is turned off. In this manner, generation of a shoot-through current flowing through the transistor 131a, the transistor 132a, and the transistor 132b can be suppressed. In addition, when the potential input into the input terminal IN_A or the input terminal IN_B is inverted so that the transistor 131b, the transistor 132a, and the transistor 132b are brought into conducting states, the transistor 136 is turned off. In this manner, generation of a shoot-through current flowing through the transistor 131b, the transistor 132a, and the transistor 132b can be suppressed.

FIG. 8B illustrates an example of a semiconductor device serving as a NAND circuit which has a different structure from that illustrated in FIG. 8A. The semiconductor device illustrated in FIG. 8B uses two transistors, the transistor 136a and the transistor 136b, whereas the semiconductor device illustrated in FIG. 8A uses one transistor 136.

In the semiconductor device illustrated in FIG. 8B, a gate terminal of the transistor 136a is electrically connected to a gate terminal of the transistor 136b, one of a source terminal and a drain terminal of the transistor 136a is electrically connected to a high potential power supply line VH, and the other of the source terminal and the drain terminal of the transistor 136a is electrically connected to a source terminal of the transistor 131a. In addition, one of a source terminal and a drain terminal of the transistor 136b is electrically connected to a high potential power supply line VH, and the other of the source terminal and the drain terminal of the transistor 136b is electrically connected to a source terminal of the transistor 131b. In addition, a gate terminal of the transistor 131a is electrically connected to a gate terminal of the transistor 132a, and a drain terminal of the transistor 131a is electrically connected to a drain terminal of the transistor 132a and a drain terminal of the transistor 131b. In addition, a gate terminal of the transistor 131b is electrically connected to a gate terminal of the transistor 132b. In addition, a source terminal of the transistor 132a is electrically connected to a drain terminal of the transistor 132b. In addition, a source terminal of the transistor 132b is electrically connected to a low potential power supply line VL.

In other words, the semiconductor device illustrated in FIG. 8B is different from the semiconductor device illustrated in FIG. 8A in that the transistor 136a and the transistor 136b are provided between the high potential power supply line VH and the transistor 131a and the transistor 131b. For other parts, the description of the semiconductor device illustrated in FIG. 8A can be referred to.

As described above, by provision of the transistor 136a and the transistor 136b between the NAND circuit 130 and the high potential power supply line VH, the power consumption in an operation period can be reduced. When the potential input into the input terminal IN_A or the input terminal IN_B is inverted so that the transistor 131a, the transistor 132a, and the transistor 132b are brought into conducting states, the transistor 136a is turned off. In this manner, generation of a shoot-through current flowing through the transistor 131a, the transistor 132a, and the transistor 132b can be suppressed. In addition, when the potential input into the input terminal IN_A or the input terminal IN_B is inverted so that the transistor 131b, the transistor 132a, and the transistor 132b are brought into conducting states, the transistor 136b is turned off. In this manner, generation of a shoot-through current flowing through the transistor 131b, the transistor 132a, and the transistor 132b can be suppressed.

Furthermore, as described above, generation of shoot-through current can be suppressed in the inverter circuit, the NOR circuit, and the NAND circuit; therefore, generation of shoot-through current can be suppressed in various types of logic circuits such as a flip flop, a divider circuit, and a ring oscillator.

Figure 9A:
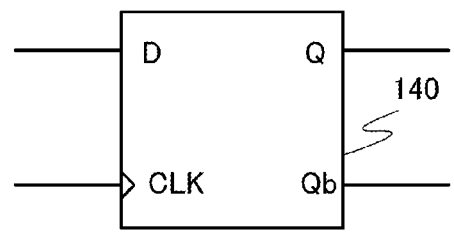
FIGS. 9A to 9D are each a circuit diagram of a semiconductor device according to one embodiment of the disclosed invention.

In FIG. 9A, a D-flip-flop is illustrated as an example of a flip-flop. In a D-flip-flop 140 illustrated in FIG. 9A, an input signal is input into a terminal D and a clock signal is input into a terminal CLK. A first output signal is output from a terminal Q and a second output signal is output from a terminal Qb.

Figure 9B:
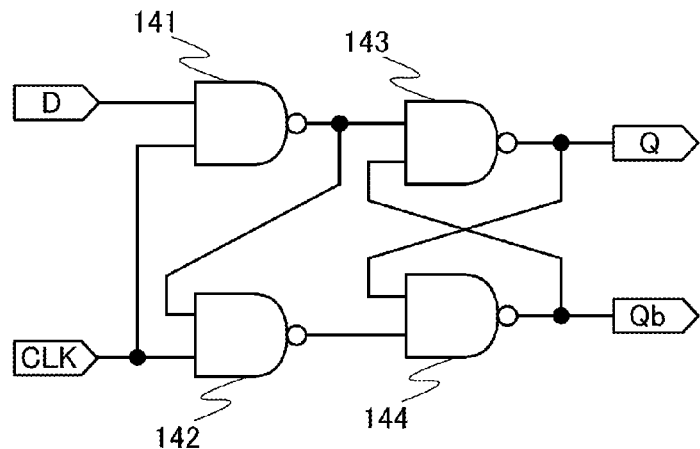

FIG. 9B illustrates an example of a specific circuit configuration of the D-flip-flop 140. The D-flip-flop 140 includes NAND circuit 141 to NAND circuit 144. A first input terminal of the NAND circuit 141 serves as the terminal D of the D-flip-flop 140, a second input terminal of the NAND circuit 141 is electrically connected to a second input terminal of the NAND circuit 142, and an output terminal of the NAND circuit 141 is electrically connected to a first input terminal of the NAND circuit 143 and a first input terminal of the NAND circuit 142. The second input terminal of the NAND circuit 142 serves as a terminal CLK of the D-flip-flop 140 and an output terminal of the NAND circuit 142 is electrically connected to a second input terminal of the NAND circuit 144. A second input terminal of the NAND circuit 143 is electrically connected to an output terminal of the NAND circuit 144, and an output terminal of the NAND circuit 143 serves as the terminal Q of the D-flip-flop 140. A first input terminal of the NAND circuit 144 is electrically connected to the output terminal of the NAND circuit 143, and an output terminal of the NAND circuit 144 serves as the terminal Qb of the D-flip-flop 140.

For the NAND circuit 141 to the NAND circuit 144, the semiconductor device serving as the NAND circuit illustrated in FIG. 8A or FIG. 8B is used, and thereby generation of shoot-through current in the NAND circuit 141 to the NAND circuit 144 can be suppressed. Thus, generation of shoot-through current in the D-flip-flop 140 is suppressed, so that power consumption in an operation period can be reduced. Note that at least a part of the NAND circuit included in the D-flip-flop 140 may have a function of suppressing generation of shoot-through current.

This embodiment has described the example in which the D-flip-flop is formed as the flip flop, but this is not a limiting example, any of the structures in this embodiment is employed for various types of flip flops such as RS-flip-flop, JK-flip-flop, and T-flip-flop, so that generation of shoot-through current can be suppressed.

Figure 9C:
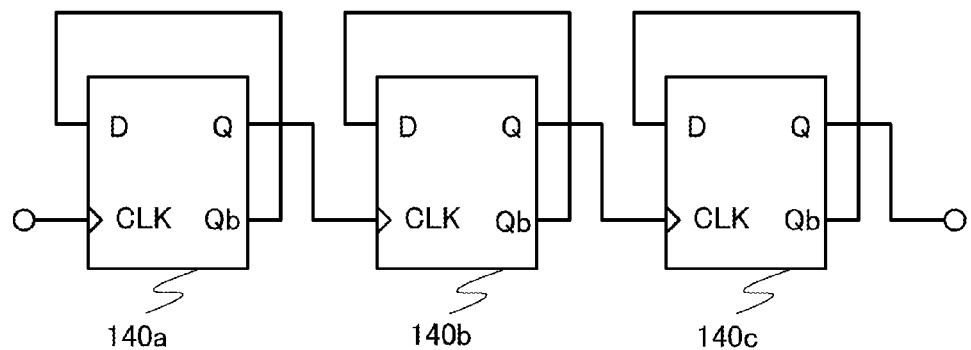

FIG. 9C illustrates an example of a divider circuit which is formed by using any of the structures in this embodiment. The divide circuit illustrated in FIG. 9C includes a D-flip-flop 140a to a D-flip-flop 140c. The D-flip-flop 140a to the D-flip-flop 140c each have a structure similar to the D-flip-flop 140 illustrated in FIG. 9A. A terminal CLK of the D-flip-flop 140a serves as an input terminal of the divider circuit, and a terminal Qb and a terminal D of the D-flip-flop 140a are electrically connected to each other, and a terminal Q of D-flip-flop 140a is electrically connected to the terminal CLK of the D-flip-flop 140b. A terminal Qb and a terminal D of the D-flip-flop 140b are electrically connected to each other, and a terminal Q of the D-flip-flop 140b is electrically connected to a terminal CLK of the D-flip-flop 140c. A terminal Qb and a terminal D of the D-flip-flop 140c are electrically connected to each other, and a terminal Q of the D-flip-flop 140c serves as an output terminal of the divider circuit.

Here, because the above-described D-flip-flops with reduced shoot-through current are used as the D-flip-flop 140a to the D-flip-flop 140c, generation of shoot-through current in the D-flip-flop 140a to the D-flip-flop 140c can be suppressed. Thus, generation of shoot-through current in the divider circuit is suppressed, and power consumption in an operation period can be reduced. Note that three D-flip-flops are used in the divider circuit illustrated in FIG. 9C, but the number of D-flip-flops is not limited to three and may be set as appropriate depending on a frequency of a clock signal to be output.

Figure 9D:
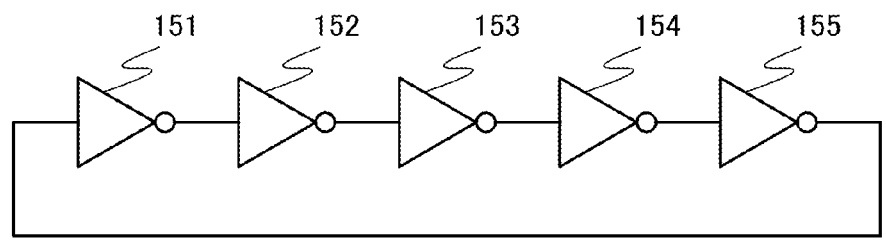

In addition, a ring oscillator formed using any of the structures described in this embodiment is illustrated as an example in FIG. 9D. The ring oscillator illustrated in FIG. 9D includes an inverter 151 to an inverter 155. An output terminal of the inverter 151 is electrically connected to an input terminal of the inverter 152; an output terminal of the inverter 152 is electrically connected to an input terminal of the inverter 153; an output terminal of the inverter 153 is electrically connected to an input terminal of the inverter 154; an output terminal of the inverter 154 is electrically connected to an input terminal of the inverter 155; and an output terminal of the inverter 155 is electrically connected to an input terminal of the inverter 151.

Here, because the semiconductor device serving as the CMOS inverter circuit illustrated in any of FIG. 1A and FIGS. 6A to 6C is used for each of the inverter 151 to the inverter 155, generation of shoot-through current in the inverter 151 to the inverter 155 can be suppressed. Thus, generation of shoot-through current in the ring oscillator is suppressed, and power consumption in an operation period can be reduced. Note that five inverters are used in the ring oscillator illustrated in FIG. 9D, but the number of inverters is not limited to five and may be set to an odd number as appropriate depending on a frequency of a clock signal to be output.

In addition, the structure of the CMOS circuit with reduced shoot-through current, described in this embodiment, is effective when it is used in place of a conventional CMOS circuit with a large amount of shoot-through current. Such a structure is described with a crystal oscillation circuit illustrated in FIG. 10 taken as an example.

Figure 10:
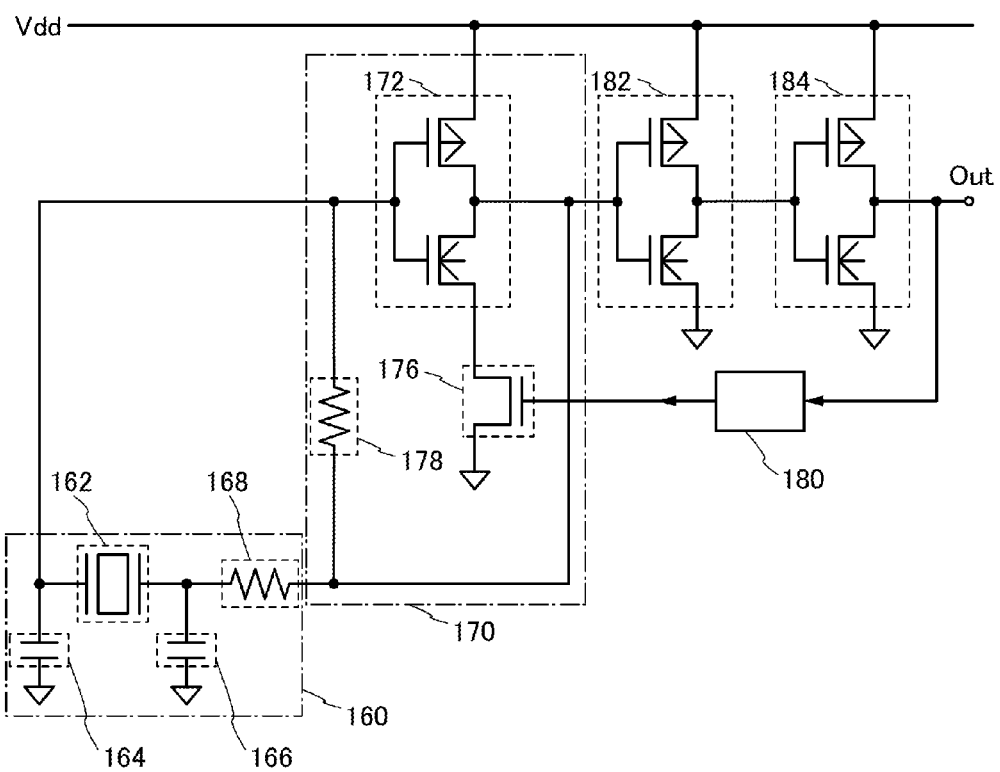
FIG. 10 is a circuit diagram of a semiconductor device according to one embodiment of the disclosed invention.

The crystal oscillation circuit illustrated in FIG. 10 includes a resonant portion 160, an amplifier 170, a control circuit 180, a CMOS inverter circuit 182, and a CMOS inverter circuit 184. The resonant portion 160 includes a crystal oscillator 162, a capacitor 164, a capacitor 166, and a resistor 168. The amplifier 170 includes a CMOS inverter circuit 172, a transistor 176, and a resistor 178.

Here, the CMOS inverter circuit 172, the CMOS inverter circuit 182, and the CMOS inverter circuit 184 have structures similar to that of the CMOS inverter circuit 100 illustrated FIG. 1A, and source terminals of p-channel transistors are electrically connected to a high potential power supply line Vdd. In addition, the transistor 176 electrically connected to the CMOS inverter circuit 172 has a structure similar to the transistor 106 illustrated in FIG. 1A, and a source terminal of an n-channel transistor of the CMOS inverter circuit 172 is grounded through the transistor 176. In addition, source terminals of n-channel transistors of the CMOS inverter circuit 182 and the CMOS inverter circuit 184 are also grounded.

In the resonant portion 160, one terminal of the crystal oscillator 162 is electrically connected to an input terminal of the CMOS inverter circuit 172, one terminal of the resistor 178, and one terminal of the capacitor 164; and the other terminal of the crystal oscillator 162 is electrically connected to one terminal of the capacitor 166 and one terminal of the resistor 168. Here, the other terminals of the capacitors 164 and 166 are grounded.

In the amplifier 170, an output terminal of the CMOS inverter circuit 172 is electrically connected to an input terminal of the CMOS inverter circuit 182, the other terminal of the resistor 178, and the other terminal of the resistor 168.

An output terminal of the CMOS inverter circuit 182 is electrically connected to an input terminal of the CMOS inverter circuit 184, and an output terminal of the CMOS inverter circuit 184 serves as an output terminal of the crystal oscillation circuit. In addition, the output terminal of the CMOS inverter circuit 184 is electrically connected to the control circuit 180, and is electrically connected to a gate terminal of the transistor 176 via the control circuit 180.

The CMOS inverter circuit 172 and the transistor 176 in the amplifier 170 correspond to the CMOS inverter circuit 100 and the transistor 106 in the semiconductor device illustrated in FIG. 1A, respectively. In FIG. 1A, a signal to be input into the control terminal IN_S is generated by the control circuit 180, depending on a potential of the output terminal of the CMOS inverter circuit 184.

As for power consumption of a conventional crystal oscillation circuit, shoot-through current of a CMOS inverter circuit used in an amplifier is dominant. In contrast, the transistor 176 is provided in the amplifier 170, and as illustrated in FIG. 1B, when the p-channel transistor and the n-channel transistor of the CMOS inverter circuit 172 are both in conducting states, the transistor 176 is turned off, thereby reducing shoot-through current in the amplifier 170. Because the shoot-through current of the amplifier 170 is reduced, power consumption in an operation period of the crystal oscillation circuit can be reduced greatly. Further, by providing the crystal oscillation circuit for a microcomputer and the like, a power-saving microcomputer can be provided.

At this time, control of the transistor 176 by the control circuit 180 may be performed after an output of the crystal oscillation circuit becomes stable.

Note that in FIG. 10, the crystal oscillation circuit is given as an example, but any of the structures of this embodiment can be applied to various types of semiconductor devices, without being limited to that example.

As described above, in the semiconductor device, between a high potential power supply line and a low potential power supply line used in a CMOS circuit, a transistor with low off-current, e.g., a transistor using an oxide semiconductor, is provided so as to be connected in series with a p-channel transistor and an n-channel transistor, and the transistor with low off-current is turned off when the p-channel transistor and the n-channel transistor are in conducting states. In this manner, generation of shoot-through current in a CMOS circuit used for a semiconductor device is suppressed and power consumption in an operation period can be reduced.

The structures, methods, and the like in this embodiment can be combined with one another, or can also be combined with any of the structures, methods, and the like in the other embodiments as appropriate.

Embodiment 2

In this embodiment, an example of a method for manufacturing the semiconductor device described in Embodiment 1 will be described with reference to FIGS. 11A to 11D, FIGS. 12A to 12C, FIGS. 13A to 13C, and FIGS. 14A and 14B. As an example, fabrication methods of the transistor 101, the transistor 102, and the transistor 106 used in the semiconductor device illustrated in FIG. 1A are described.

Note that the transistor formed using silicon or the like, which is described in the above embodiment, can be formed using a material and a method that are similar to those of the transistor 101 or the transistor 102. Further, the transistor formed using an oxide semiconductor or the like, which is described in the above embodiment, can be formed using a material and a method that are similar to those of the transistor 106. Thus, various types of logic circuits such as the CMOS inverter circuit illustrated in FIGS. 6A to 6C, the NOR circuits illustrated in FIGS. 7A and 7B, and the NAND circuits illustrated in FIGS. 8A and 8B, can be formed by such similar methods.

Figure 11A:
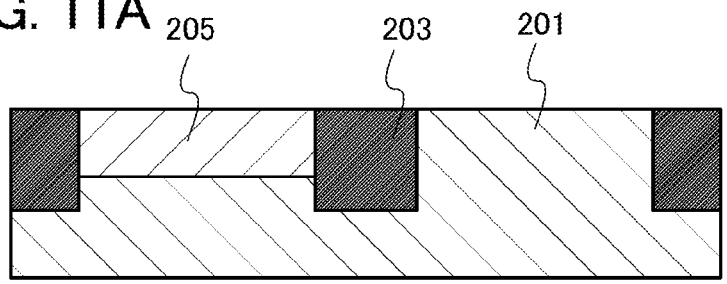
FIGS. 11A to 11D are cross-sectional views of a semiconductor device according to one embodiment of the disclosed invention.

First, as illustrated in FIG. 11A, an element isolation region 203 is formed in an n-type semiconductor substrate 201, and then a p-well region 205 is formed in a part of the n-type semiconductor substrate 201.

Examples of substrates used as the n-type semiconductor substrate 201 include a single crystal silicon substrate (a silicon wafer) having n-type conductivity, and a compound semiconductor substrate (e.g., a SiC substrate, a GaN substrate, and the like).

A silicon-on-insulator (SOI) substrate can also be used instead of the n-type semiconductor substrate 201. Examples of the SOI substrate include a so-called SIMOX (separation by implanted oxygen) substrate which is formed in such a manner that after an oxygen ion is implanted into a mirror-polished wafer, an oxide layer is formed at a certain depth from the surface and defects generated in a surface layer are eliminated by high-temperature heating; an SOI substrate formed by the Smart-Cut process in which a semiconductor substrate is cleaved by utilizing growth of a minute void, which is formed by implantation of a hydrogen ion, by heat treatment; and an SOI substrate formed by ELTRAN (epitaxial layer transfer: a registered trademark of Canon Inc.); and the like.

The element isolation region 203 can be formed by a local oxidation of silicon (LOCOS) method, a shallow trench isolation (STI) method, or the like.

An impurity element imparting p-type conductivity, such as boron, is added to the p-well region 205 at a concentration of approximately $5 \times 10^{15}$ cm$^{-3}$ to $1 \times 10^{16}$ cm$^3$. The p-well region 205 is formed in such a manner that a mask is formed over a part of the semiconductor substrate 201, and an impurity element imparting p-type conductivity, such as boron, is added to a part of the semiconductor substrate 201.

Here, an n-type semiconductor substrate is used, but it is also possible to use a p-type semiconductor substrate. An n-well region may be formed in the p-type semiconductor substrate by addition of an n-type impurity element such as phosphorus or arsenic.

Next, a gate insulating film 207, a gate electrode 209a, and a gate electrode 209b are formed over the semiconductor substrate 201. Here, the gate electrode 209a is formed over the p-well region 205 and the gate electrode 209b is formed over a region in which the p-well region 205 is not formed.

Heat treatment is performed on a surface of the semiconductor substrate 201 to oxidize the surface, whereby a silicon oxide film is formed as the gate insulating film 207. Alternatively, a silicon oxide film is formed by a thermal oxidation method, and then a surface of the silicon oxide film is nitrided by a nitridation treatment; thus a stacked structure including the silicon oxide film and the silicon film containing oxygen and nitrogen (silicon oxynitride film) is formed. Alternatively, the gate insulating film 207 is formed in such a manner that silicon oxide, silicon oxynitride, metal oxide such as tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like is formed to have a thickness of 5 nm to 50 nm by a CVD method, a sputtering method, or the like.

The gate electrode 209a and the gate electrode 209b are preferably formed using a metal selected from the group of tantalum, tungsten, titanium, molybdenum, chromium, niobium, and the like, or an alloy material or a compound material including any of the metals as its main component. Further, polycrystalline silicon to which an impurity element such as phosphorus is added can be used. Alternatively, the gate electrode 209a and the gate electrode 209b may have a stacked structure including a metal nitride film and a film of any of the above metals. As the metal nitride, tungsten nitride, molybdenum nitride, or titanium nitride can be used. When the metal nitride film is provided, adhesiveness of the metal film can be increased; accordingly, peeling can be prevented.

The gate electrode 209a and the gate electrode 209b are formed in such a manner that a conductive film is formed by a sputtering method, a CVD method, or the like and then a part of the conductive film is selectively etched.

Here, the surface of the semiconductor substrate 201 is oxidized by heat treatment, so that a silicon oxide film is formed; a conductive film including a stack of a tantalum nitride film and a tungsten film is formed over the silicon oxide film by a sputtering method; and then a part of the conductive film is selectively etched. In this manner, the gate electrode 209a, and the gate electrode 209b are formed.

Figure 11B:
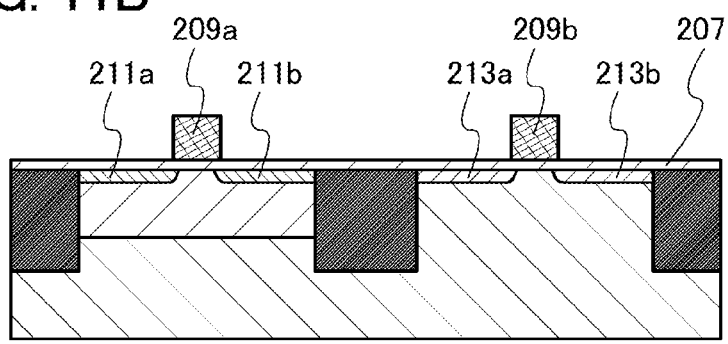

Next, as illustrated in FIG. 11B, an impurity element imparting p-type conductivity is added to the semiconductor substrate 201, so that a p-type impurity region 213a and a p-type impurity region 213b are formed. Further, an impurity element imparting n-type conductivity is added to the p-well region 205, so that n-type impurity regions 211a and 211b are formed. In this manner, the impurity regions 211a and 211b with shallow junctions are formed so as to place the gate electrode 209a therebetween and the impurity regions 213a and 213b with shallow junctions are formed so as to place the gate electrode 209b therebetween. Here, as the impurity element imparting p-type conductivity, boron (B), aluminum (Al), or the like may be used, and as the impurity element imparting n-type conductivity, phosphorus (P), arsenic (As), or the like may be used. The impurity element imparting p-type conductivity and the impurity element imparting n-type conductivity may be added as appropriate by an ion doping method, an ion implantation method, or the like. In addition, the concentration of the impurities added can be set as appropriate; the concentration of the impurities added is preferably increased when the semiconductor element is highly minimized.

Next, an insulating film is formed so as to cover the gate insulating film 207, the gate electrode 209a, the gate electrode 209b, and the like, highly-anisotropic etching is conducted to the insulating film to form sidewall insulating films 216 and 218 in a self-alignment manner. In addition, at the same time, the gate insulating film 207 is etched to form gate insulating films 207a and 207b. The insulating film used as the sidewall insulating films 216 and 218 may be an insulating film similar to the gate insulating film 207. As the etching, dry etching is preferably performed, but wet etching may be performed. An etching gas and an etchant can be selected as appropriate depending on a material of a layer to be etched.

In this manner, the sidewall insulating film 216 is formed so as to be in contact with the side surface of the gate electrode 209a and the sidewall insulating film 218 is formed so as to be in contact with the side surface of the gate electrode 209b. In addition, the gate insulating film 207a is formed so as to overlap with the gate electrode 209a and the sidewall insulating film 216, and the gate insulating film 207b is formed so as to overlap with the gate electrode 209b and the sidewall insulating film 218.

Note that for high integration, it is also possible to take a structure in which the sidewall insulating layers are not provided on side surfaces of the gate electrode 209a and the gate electrode 209b.

Figure 11C:
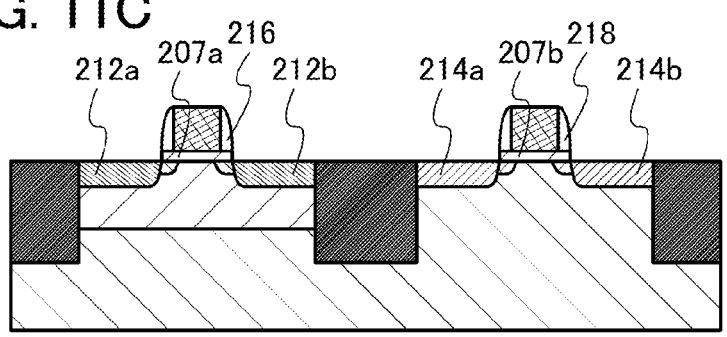

Next, as illustrated in FIG. 11C, an impurity element imparting p-type conductivity is added to regions of the impurity regions 213a and 213b which do not overlap with the sidewall insulating film 218 to form the p-type impurity regions 214a and 214b having high impurity concentrations. In addition, an impurity element imparting n-type conductivity is added to regions of the impurity regions 211a and 211b of the p well region 205, which do not overlap with the sidewall insulating film 216 to form the n-type impurity regions 212a and 212b. This step can be conducted by a method similar to the formation method of the impurity regions 211a, 211b, 213a, and 213b. In addition, before the impurity regions 212a, 212b, 214a, and 214b are formed, an insulating film serving as a protective film may be formed over the impurity regions 211a, 211b, 213a, and 213b.

Figure 11D:
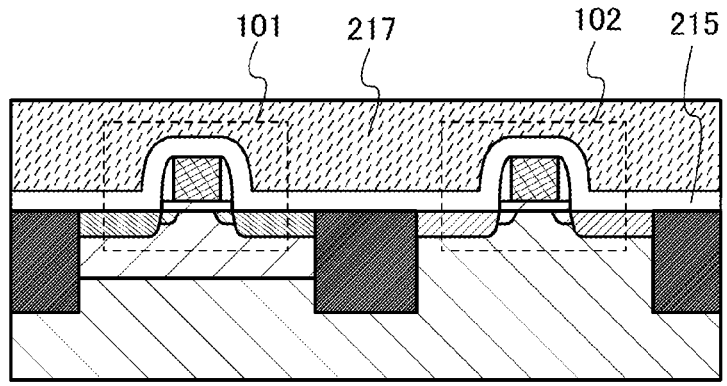

Next, as illustrated in FIG. 11D, an insulating film 215 and an insulating film 217 are formed by a sputtering method, a CVD method, or the like over the semiconductor substrate 201, the element isolation region 203, the gate insulating films 207a and 207b, and the gate electrodes 209a and 209b.

The insulating films 215 and 217 may each be formed with a single layer or a stacked layer including one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, a hydrogen content of the insulating film 215 can be increased. Heat treatment is performed using the insulating film 215 formed in this manner, whereby it is possible to hydrogenate the semiconductor substrate, to terminate a dangling bond by hydrogen, and to reduce defects in the semiconductor substrate.

Note that the planarity of the insulating film 217 can be enhanced, with use of an inorganic material such as borophosphosilicate glass (BPSG), or an organic material such as polyimide or acrylic for forming the insulating film 217.

After the formation of the insulating film 215 or the insulating film 217, heat treatment is performed to activate the impurity elements added to the above-described impurity regions.

Through the above steps, as illustrated in FIG. 11D, the n-channel transistor 101 and the p-channel transistor 102 can be formed. Here, the transistors 101 and 102 are each formed using a semiconductor other than an oxide semiconductor, such as single crystal silicon, so that the transistors 101 and 102 can operate at high speed.

Next, parts of the insulating films 215 and 217 are selectively etched to form opening portions. Then, contact plugs 219a to 219d are formed in the opening portions. Typically, the contact plugs 219a to 219d are formed in such a manner that after a conductive film is formed by a sputtering method, a CVD method, or the like, planarization treatment is performed by a chemical mechanical polishing (CMP) method, etching, or the like, and an unnecessary portion of the conductive film is removed.

The conductive film to serve as the contact plugs 219a to 219d is formed in such a manner that tungsten silicide is formed by a CVD method using a $WF_6$ gas and a $SiH_4$ gas to fill the opening portions.

Figure 12A:
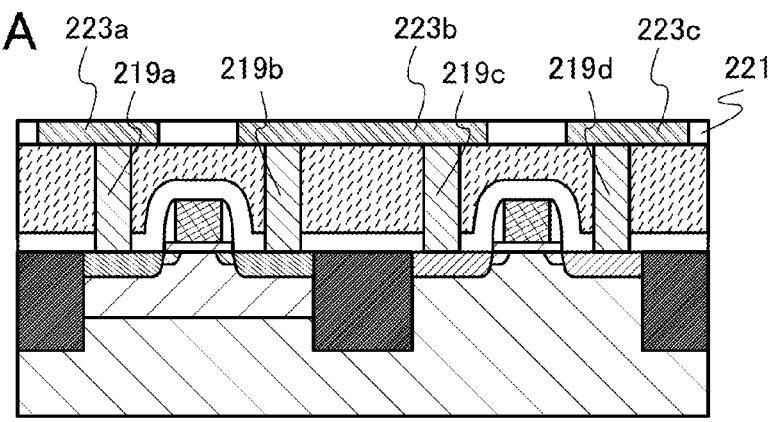
FIGS. 12A to 12C are cross-sectional views of the semiconductor device according to one embodiment of the disclosed invention.

Next, an insulating film is formed by a sputtering method, a CVD method, or the like over the insulating film 217 and the contact plugs 219a to 219d, and then, a part of the insulating film is selectively etched to form an insulating film 221 having a groove portion. Next, as illustrated in FIG. 12A, after a conductive film is formed by a sputtering method, a CVD method, or the like, planarization treatment is performed by a CMP method, etching, or the like, and an unnecessary portion of the conductive film is removed; thus, wirings 223a to 223c are formed.

Here, the wiring 223a corresponds to the source terminal of the transistor 101 illustrated in FIG. 1A, and is electrically connected to the high potential power supply line. In addition, the wiring 223c corresponds to the source terminal of the transistor 102 illustrated in FIG. 1A, and is electrically connected to one of the source terminal and the drain terminal of the transistor 106 illustrated in FIG. 1A. Further, the wiring 223b corresponds to the drain terminal of the transistor 101 and the drain terminal of the transistor 102 illustrated in FIG. 1A, and serves as the output terminal OUT illustrated in FIG. 1A. Note that although not illustrated, the gate electrode 209a and the gate electrode 209a are electrically connected to each other by the conductive layer formed in the same layer as the contact plugs 219a to 219d and the wirings 223a to 223c, and serve as the input terminal IN illustrated in FIG. 1A.

The insulating film 221 can be formed using a material similar to that of the insulating film 215.

The wirings 223a to 223c are formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

Figure 12B:
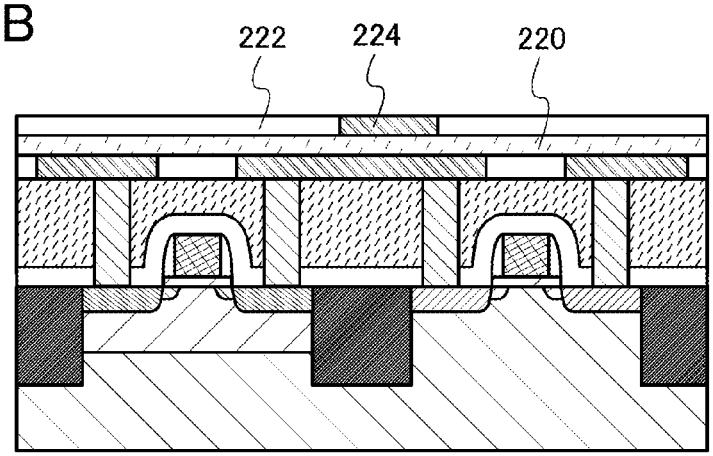

Next, an insulating film 220 is formed over the insulating film 221, the wiring 223a, and the wiring 223b by sputtering, CVD, or the like. An insulating film is formed over the insulating film 220 by sputtering, CVD, or the like, and then a part of the insulating film is selectively etched to form an insulating film 222 having a groove portion. Then, as illustrated in FIG. 12B, after a conductive film is formed by sputtering, CVD, or the like, planarization treatment is performed by CMP, etching, or the like, and an unnecessary portion of the conductive film is removed; thus, an electrode 224 is formed.

Here, each of the insulating film 220 and the insulating film 222 can be formed using a material that is similar to the material of the insulating film 215. Note that a preferable material of the insulating film 220 is a material having a selectivity ratio with respect to a material of the insulating film 222.

Here, the electrode 224 functions as a back gate electrode of the transistor 106 to be described later. The electrode 224 can control the threshold voltage of the transistor 106. The electrode 224 may be electrically isolated (floating) or may be supplied with a potential from another element. The state of the electrode 224 can be set as appropriate depending on control of the threshold voltage of the transistor 106. Note that the material of the electrode 224 can be similar to the material of a gate electrode 233 to be described later.

Note that in this embodiment, the electrode 224 is provided over the wiring 223a and the wiring 223b. However, for example, the electrode 224 may be formed in the same conductive layer as the wiring 223a and the wiring 223b without being limited to the structure of this embodiment.

Using the insulating film 222 and the electrode 224 which are planarized, variations in electrical characteristics of a transistor including an oxide semiconductor film to be formed later can be reduced. Further, the transistor including an oxide semiconductor film can be formed with a high yield.

Next, heat treatment or plasma treatment is preferably performed so that hydrogen contained in the insulating film 221, the wirings 223a, 223b, and 223c the insulating films 220 and 222, and the electrode 224 is released. Consequently, in heat treatment performed later, diffusion of hydrogen into an insulating film and an oxide semiconductor film to be formed later can be prevented. The heat treatment is performed at a temperature of 100° C. or higher and lower than the strain point of the substrate in an inert atmosphere, a reduced-pressure atmosphere, or a dry air atmosphere. Further, for the plasma treatment, rare gas, oxygen, nitrogen, or nitrogen oxide (e.g., nitrous oxide, nitrogen monoxide, or nitrogen dioxide) is used.

Next, an insulating film 225 is formed over the insulating film 222 and the electrode 224 by sputtering, CVD, or the like. The insulating film 225 can be formed with a single layer or a stacked layer using one or more of silicon oxide, silicon oxynitride, silicon nitride oxide, gallium oxide, hafnium oxide, yttrium oxide, aluminum oxide, and aluminum oxynitride. The insulating film 225 is preferably formed using an oxide insulating film from which some contained oxygen is released by heat treatment. As such an oxide insulating film from which part of oxygen is released by heat treatment, an oxide insulating film containing oxygen at a proportion exceeding the stoichiometric proportion is preferably used. Oxygen is released by heat treatment from the oxide insulating film from which part of oxygen is released by heat treatment; therefore, oxygen can be diffused into the oxide semiconductor film by heat treatment performed in a later step.

In the case where the insulating film 225 has a stacked-layer structure, an insulating film at the bottom layer of the stacked-layer structure is preferably an insulating film serving as a barrier film that prevents the entry of an impurity that disperses from a lower layer(s). In particular, in the case where a single crystal silicon substrate, an SOI substrate, a substrate over which a semiconductor element formed using silicon or the like is provided, or the like is used as the semiconductor substrate 201, hydrogen or the like contained in the substrate can be prevented from being diffused and entering an oxide semiconductor film to be formed later. Such an insulating film can be formed using, for example, a silicon nitride film, a silicon nitride oxide film, or an aluminum oxide film deposited by a plasma CVD method or a sputtering method.

The insulating film 225 is preferably planarized by CMP treatment or the like. The surface of the insulating film 225 has an average surface roughness ($R_a$) of 1 nm or less, preferably 0.3 nm or less, further preferably 0.1 nm or less.

Note that in this specification and the like, the average surface roughness ($R_a$) is obtained by expanding arithmetic mean surface roughness, which is defined by JIS B 0601:2001 (ISO4287:1997), into three dimensions so as to be applied to a curved surface, and is an average value of the absolute values of deviations from a reference surface to a specific surface.

When the specific surface is expressed as $Z=F(X,Y)$, the average surface roughness ($R_a$) is an average value of the absolute values of deviations from the reference surface to the specific surface and is shown by the following formula.

$$R_a = \frac{1}{S_0} \int_{Y_1}^{Y_2} \int_{X_1}^{X_2} |F(X, Y) - Z_0| dX dY \quad \text{[FORMULA 1]}$$

The specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Here, $S_0$ represents the area of a rectangle which is obtained by projecting the specific surface on the xy plane, and $Z_0$ represents the height of the reference surface (the average height of the specific surface). The average surface roughness ($R_a$) can be measured using an atomic force microscope (AFM).

The CMP treatment may be performed once or plural times. When the CMP treatment is performed plural times, first polishing is preferably performed with a high polishing rate followed by final polishing with a low polishing rate. By performing polishing steps with different polishing rates in combination, the planarity of the surface of the insulating film 225 can be further increased.

Alternatively, plasma treatment can be used as the planarization treatment of the insulating film 225. The plasma treatment is performed in such a manner that an inert gas, for example, a rare gas such as an argon gas, is introduced into a vacuum chamber and an electric field is applied such that a surface to be processed serves as a cathode. The plasma treatment has the same principle as a plasma dry etching method, except that an inert gas is used in the plasma treatment. That is, the plasma treatment is treatment in which the surface to be processed is irradiated with ions of an inert gas and minute unevenness of the surface is reduced by a sputtering effect. Therefore, the plasma treatment can also be referred to as "reverse sputtering treatment".

When the plasma treatment is performed, electrons and argon cations are present in plasma and the argon cations are accelerated in a cathode direction. The surface to be processed is subjected to sputtering by the accelerated argon cations. At that time, a projected portion of the surface to be processed is preferentially subjected to sputtering. Particles ejected from the surface to be processed attach to another place of the surface to be processed. At that time, the particles preferentially attach to a depressed portion of the surface to be processed. By thus partially removing the projected portion and filling the depressed portion, planarity of the surface to be processed is increased. Note that a combination of plasma treatment and CMP treatment can further planarize the insulating film 225.

Note that through the plasma treatment, it is possible to remove impurities, such as oxygen, moisture, and an organic compound, attached onto the surface of the insulating film 225 by a sputtering effect.

Preferably, impurities such as hydrogen, water, a hydroxyl group, and a hydride in a deposition chamber are removed by heating and evacuation of the deposition chamber before formation of the oxide semiconductor. It is particularly important to remove such impurities attached to an inner wall of the deposition chamber. Here, the heat treatment may be performed at a temperature of from 100° C. to 450° C. The evacuation of the treatment chamber is preferably performed with a rough vacuum pump such as a dry pump, and a high vacuum pump such as a sputter ion pump, a turbo molecular pump, or a cryopump in appropriate combination. The turbo molecular pump has an outstanding capability in evacuating a large-sized molecule, whereas it has a low capability in evacuating hydrogen or water. Further, a combination with a cryopump having a high capability in evacuating water or a sputter ion pump having a high capability in evacuating hydrogen is effective. At this time, when the impurities are removed while an inert gas is introduced, the rate of elimination of water or the like, which is difficult to eliminate only by evacuation, can be further increased. Removal of impurities in the deposition chamber by such treatment before the film formation of the oxide semiconductor can prevent hydrogen, water, a hydroxyl group, a hydride, and the like from entering the oxide semiconductor.

Before the oxide semiconductor film is formed in a sputtering apparatus, a dummy substrate may be put in the sputtering apparatus, an oxide semiconductor film may be formed over the dummy substrate, and then hydrogen and moisture attached to the target surface or a deposition shield may be removed.

Figure 12C:
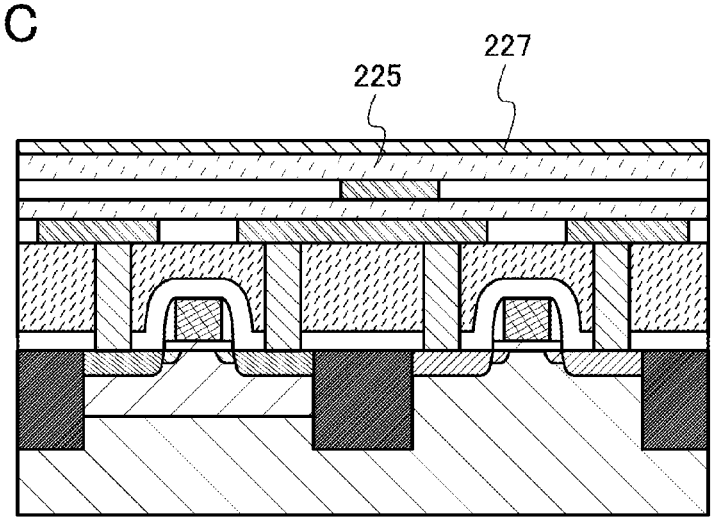

Next, an oxide semiconductor film 227 is formed over the insulating film 225 by a method such as sputtering, coating, printing, vapor deposition, PCVD, PLD, ALD, or MBE (see FIG. 12C). Here, as the oxide semiconductor film 227, an oxide semiconductor film having a thickness of from 1 nm to 50 nm, preferably from 3 nm to 20 nm is formed by a sputtering method. When the oxide semiconductor film 227 has a thickness in the above range, a short-channel effect, which might be caused due to miniaturization of the transistor, can be prevented.

An oxide semiconductor used for the oxide semiconductor film 227 preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide, tin oxide, zinc oxide, an In—Zn-based oxide, a Sn—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Sn—Zn-based oxide, a Sn—Ga—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, or an In—Sn—Hf—Zn-based oxide. Moreover, silicon oxide may be included in the above oxide semiconductor. Here, for example, an In—Ga—Zn-based oxide means an oxide containing indium (In), gallium (Ga), and zinc (Zn) as its main components and there is no particular limitation on the ratio of In:Ga:Zn. The In—Ga—Zn-based oxide may contain a metal element other than the In, Ga, and Zn. In this case, the amount of oxygen in the oxide semiconductor preferably exceeds the stoichiometric proportion. When the amount of oxygen exceeds the stoichiometric proportion, generation of carriers which results from oxygen vacancies in the oxide semiconductor film can be suppressed.

Alternatively, a material represented by $InMO_3(ZnO)_n$, (m>0 where m is not an integer) may be used as an oxide semiconductor. Note that M represents one or more metal elements selected from the group of Ga, Fe, Mn, and Co. Alternatively, as the oxide semiconductor, a material expressed by a chemical formula, $In_2SnO_5(ZnO)_n$ (n>0 where n is an integer) may be used.

Note that the concentration of alkali metals or alkaline earth metals in the oxide semiconductor film 227 is preferably $1\times10^{18}$ atoms/cm$^3$ or lower, further preferably $2\times10^{16}$ atoms/cm$^3$ or lower. When an alkali metal or an alkaline earth metal is bonded to an oxide semiconductor, carriers are generated in some cases, which increases off-state current of the transistor.

The oxide semiconductor film 227 may contain nitrogen at a concentration of $5\times10^{18}$ atoms/cm$^3$ or lower.

As an oxide semiconductor which can be used for the oxide semiconductor film 227, a wide bandgap semiconductor which has a wider bandgap and lower intrinsic carrier density than a silicon semiconductor is used. The band gap of the wide bandgap semiconductor is from 2.5 eV to 4 eV, preferably from 3 eV to 3.8 eV. In this manner, off-state current of a transistor can be reduced by using an oxide semiconductor having a wide energy gap.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region and the whole of which is amorphous.

The microcrystalline oxide semiconductor film includes a microcrystal (also referred to as nanocrystal) with a size of 1 nm or more and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to a TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to a TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the InGaZnO$_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in the layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in a part of the CAAC-OS film. It is preferable for the CAAC-OS film that a peak of $2\theta$ appears at around 31° and a peak of $2\theta$ does not appear at around 36°.

With the use of the CAAC-OS film in a transistor, change in electric characteristics of the transistor due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

In an oxide semiconductor having crystallinity, defects in the bulk can be further reduced and when surface flatness is improved, mobility higher than that of an oxide semiconductor layer in an amorphous state can be realized. In order to improve the surface flatness, the oxide semiconductor is preferably formed over a flat surface. As described above, the average surface roughness ($R_a$) of the surface of the insulating film 225 is 1 nm or less, preferably 0.3 nm or less, further preferably 0.1 nm or less, and the oxide semiconductor film 227 is preferably formed thereover.

Here, the oxide semiconductor film 227 is formed by a sputtering method. As a target, a target corresponding to the above oxide can be used.

In the case where an In—Ga—Zn—O-based material is used as the oxide semiconductor, the target can be formed as appropriate in accordance with a material of the oxide semiconductor film 227 and the composition thereof. For example, an In—Ga—Zn-based oxide with an atomic ratio where In:Ga:Zn=1:1:1, In:Ga:Zn=1:3:2, In:Ga:Zn=3:1:2, or In:Ga:Zn=2:1:3, or an oxide whose composition is in the neighborhood of the above compositions can be used as a target. However, a material and composition of a target are not limited to the above.

However, the composition is not limited to those described above, and a material having the appropriate composition may be used depending on necessary semiconductor characteristics (e.g., mobility, threshold voltage, and variation). In order to obtain the required semiconductor characteristics, the carrier concentration, the impurity concentration, the defect density, the atomic ratio between a metal element and oxygen, the interatomic distance, the density, and the like are preferably set to appropriate values. Alternatively, oxide semiconductor films which have different constitutions (typified by composition) may be stacked or may be separately provided in the channel formation region and source and drain regions as appropriate.

For example, the oxide semiconductor film 227 may be a stacked layer of a first oxide semiconductor film, a second oxide semiconductor film, and a third oxide semiconductor film, which have different compositions from each other. For example, preferably, the first to third oxide semiconductor films are formed using materials that contain the same components. In the case where the materials containing the same components are used, the second oxide semiconductor film can be formed over the first oxide semiconductor film using a crystal layer of the first oxide semiconductor film as a seed; therefore, crystal growth of the second oxide semiconductor film can be easily caused. The same can apply to the third oxide semiconductor film. In addition, in the case where the materials including the same components are used, an interface property such as adhesion or electric characteristics is good.

Further, the constituent elements of the first oxide semiconductor film, the second oxide semiconductor film, and the third oxide semiconductor film may be the same whereas the compositions of the constituent elements of the first oxide semiconductor film, the second oxide semiconductor film, and the third oxide semiconductor film may be different. For example, the first oxide semiconductor film and the third oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film and the third oxide semiconductor film may each have an atomic ratio of In:Ga:Zn=1:3:2, and the second oxide semiconductor film may have an atomic ratio of In:Ga:Zn=1:1:1.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas. Further, in order to prevent hydrogen, water, a hydroxyl group, hydride, and the like from entering the oxide semiconductor film, as a sputtering gas, it is preferable to use an atmosphere of a high-purity gas from which impurities such as hydrogen, water, a hydroxyl group, and hydride are sufficiently removed.

In a sputtering method, an RF power supply device, an AC power supply device, a DC power supply device, or the like can be used as a power supply device for generating plasma as appropriate.

Note that the leakage rate of a treatment chamber in which the oxide semiconductor film is formed is preferably $1\times10^{-10}$ Pa·m³/sec. or lower, whereby entry of an impurity into the film to be formed by a sputtering method can be decreased. As described above, in the process for forming the oxide semiconductor film and preferably in the process for forming the oxide insulating film, entry of impurities is prevented as much as possible through control of the pressure of the treatment chamber, leakage rate of the treatment chamber, and the like, whereby entry of impurities including hydrogen into the oxide semiconductor film can be reduced. In addition, diffusion of impurities such as hydrogen from the oxide insulating film to the oxide semiconductor film can be reduced.

For the deposition of the CAAC-OS film, the following conditions are preferably used.

By reducing the concentration of impurities in the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle is attached to a substrate surface. Specifically, the substrate heating temperature during the deposition is from 100° C. to 740° C., preferably from 200° C. to 500° C. By increasing the substrate heating temperature during the deposition, when the flat-plate-like sputtered particle reaches the substrate, migration occurs on the substrate surface, so that a flat plane of the flat-plate-like sputtered particles is attached to the substrate.

Furthermore, preferably, the proportion of oxygen in the deposition gas is increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_x$ powder, $GaO_y$ powder, and $ZnO_z$ powder in a predetermined ratio, applying pressure, and performing heat treatment at a temperature from 1000° C. to 1500° C. Note that X, Y, and Z are each a given positive number. Here, the predetermined molar ratio of $InO_x$ powder to $GaO_y$ powder and $ZnO_z$ powder is, for example, 2:2:1, 8:4:3, 3:1:1, 1:1:1, 4:2:3, or 3:1:2. The kinds of powder and the molar ratio for mixing powder may be determined as appropriate depending on a desired sputtering target.

After the oxide semiconductor film 227 is formed, the oxide semiconductor film 227 may be subjected to heat treatment. The heat treatment can further remove a substance including a hydrogen atom in the oxide semiconductor film 227; thus, a structure of the oxide semiconductor film 227 can be enhanced and defect levels in the energy gap can be reduced. The heat treatment is performed in an inert gas atmosphere at a temperature from 300° C. to 700° C., preferably from 450° C. to 600° C., or less than a strain point of the substrate if the substrate has the strain point. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is 6 N (99.9999%) or more, preferably 7 N (99.99999%) or more (that is, the concentration of the impurities is 1 ppm or lower, preferably 0.1 ppm or lower).

The heat treatment can be performed in such a way that, for example, the semiconductor substrate 201 is introduced into an electric furnace using a resistance heating element or the like and heated at 450° C. under a nitrogen atmosphere for an hour.

The heat treatment apparatus is not limited to the electric furnace and may be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used. If a GRTA apparatus is used as the heat treatment apparatus, a substrate may be heated in an inert gas heated to high temperature of 650° C. to 700° C. because the heat treatment time is short.

In addition, after the oxide semiconductor film 227 is heated by the heat treatment, a high-purity oxygen gas, a high-purity $N_2O$ gas, or ultra dry air (the moisture concentration is 20 ppm or lower (−55° C. by conversion into a dew point), preferably 1 ppm or lower, more preferably 10 ppb or lower, in the measurement with the use of a dew point meter of a cavity ring down laser spectroscopy (CRDS) system) may be introduced into the same furnace. It is preferable that water, hydrogen, and the like are not contained in these gases in particular. The purity of the oxygen gas or the $N_2O$ gas that is introduced into the same furnace is preferably 6N or more, more preferably 7N or more (i.e., the concentration of impurities in the oxygen gas or the $N_2O$ gas is preferably 1 ppm or lower, more preferably 0.1 ppm or lower). By the action of the oxygen gas or the $N_2O$ gas, oxygen which is one of a main component of the oxide semiconductor and which has been reduced through the step for removing impurities by dehydration or dehydrogenation can be supplied.

The above heat treatment has an effect of removing hydrogen, water, and the like and can be referred to as dehydration, dehydrogenation, or the like. The heat treatment can be performed at a timing, for example, before the oxide semiconductor layer is processed to have an island shape, after the gate insulating film is formed, or the like. The number of times of such heat treatment for dehydration or dehydrogenation is not limited to one and may be two or more.

Figure 13A:
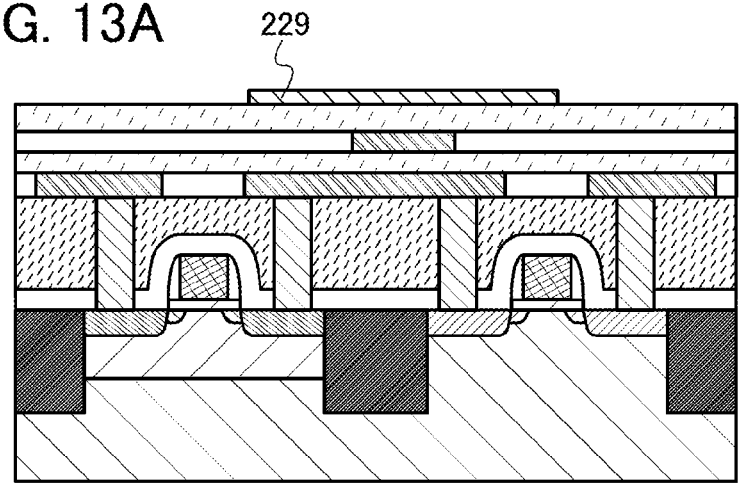
FIGS. 13A to 13C are cross-sectional views of the semiconductor device according to one embodiment of the disclosed invention.

Next, as illustrated in FIG. 13A, a part of the oxide semiconductor film 227 is selectively etched, so that an oxide semiconductor film 229 is formed to overlap with the electrode 224.

Figure 13B:
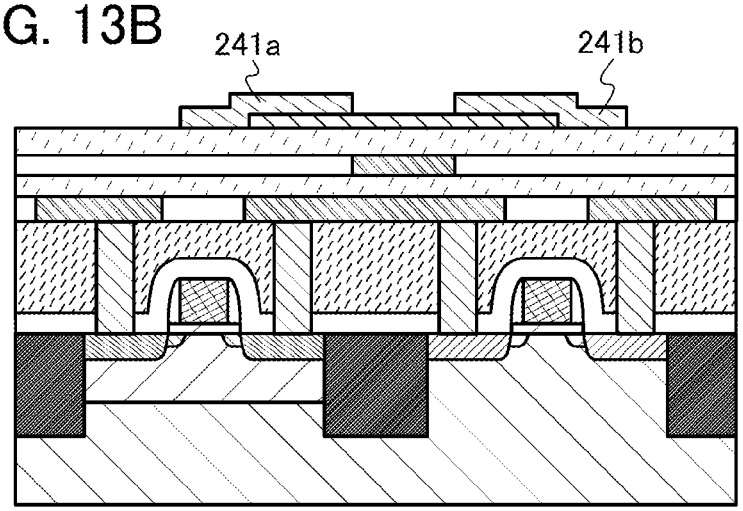

Next, as illustrated in FIG. 13B, a conductive film is formed over and in contact with the oxide semiconductor film 229 and a part of the conductive film is selectively etched, whereby a pair of electrodes 241a and 241b are formed over and in contact with the oxide semiconductor film 229.

The pair of electrodes 241a and 241b can be formed using a material similar to that of the wirings 223a and 223b, as appropriate. Note that the pair of electrodes 241a and 241b may function as wirings.

The pair of electrodes 241a and 241b are formed in such a manner that a conductive film is formed by a sputtering method, a CVD method, an evaporation method, or the like and then a part of the conductive film is selectively etched. Alternatively, the pair of electrodes 241a and 241b can be formed by a printing method or an inkjet method.

Figure 13C:
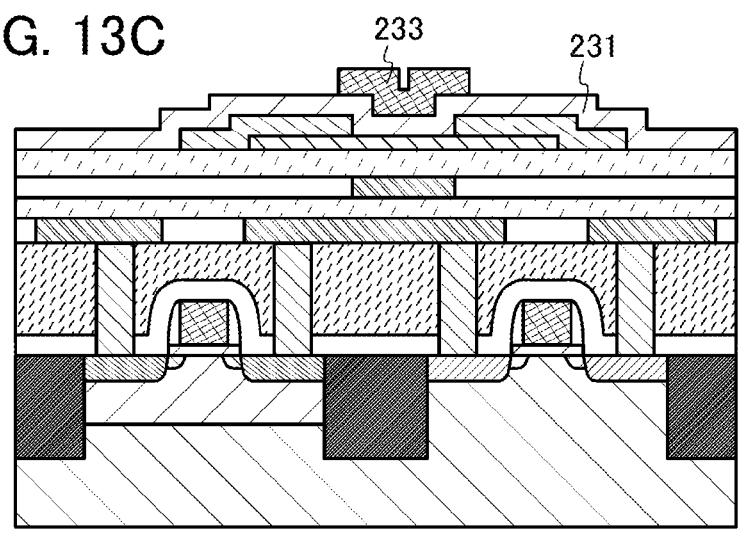

Next, a gate insulating film 231 is formed over the oxide semiconductor film 229 and the electrodes 241a and 241b by a sputtering method, a CVD method, or the like. Then, as illustrated in FIG. 13C, a gate electrode 233 is formed over the gate insulating film 231 so as to overlap with the oxide semiconductor film 229.

The gate insulating film 231 may be formed to have a single layer or a stacked layer including one or more of silicon oxide, silicon oxynitride, silicon nitride oxide, silicon nitride, aluminum oxide, hafnium oxide, gallium oxide, a Ga—Zn—O-based metal oxide, and the like. The gate insulating film 231 may be an oxide insulating film from which oxygen is released by heating, such as a film that can be used as the insulating film 225. By using a film from which oxygen is released by heating as the gate insulating film 231, oxygen vacancies caused in the oxide semiconductor film 229 can be reduced by heat treatment performed later and deterioration of electrical characteristics of the transistor can be suppressed.

A high-density plasma-enhanced CVD using microwaves (e.g., with a frequency of 2.45 GHz) is preferably employed for forming the gate insulating film 231 serving as a gate insulating film because a high-quality insulating layer which is dense and has high breakdown voltage can be formed. This is because when the highly purified oxide semiconductor is closely in contact with the high-quality gate insulating film, the interface state can be reduced and interface properties can be favorable.

When the gate insulating film 231 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be reduced even when the thickness of the gate insulating film is small.

The thickness of the gate insulating film 231 is preferably from 1 nm to 300 nm, more preferably from 5 nm to 50 nm, still more preferably from 10 nm to 30 nm.

The gate electrode 233 can be formed using a metal element selected from the group of aluminum, chromium, copper, tantalum, titanium, molybdenum, and tungsten; an alloy containing any of these metal elements as a component; an alloy containing these metal elements in combination; or the like. Alternatively, as another metal element, one of manganese and zirconium or both may be used. The gate electrode 233 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from the group of titanium, tantalum, tungsten, molybdenum, chromium, neodymium, and scandium may be used.

Alternatively, the gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using any of the above light-transmitting conductive materials and any of the above metal elements.

The gate electrode 233 is formed by a printing method or an inkjet method. Alternatively, the gate electrode 233 is formed in such a manner that a conductive film is formed by a sputtering method, a CVD method, an evaporation method, or the like and then part of the conductive film is selectively etched.

Further, as a material layer that is in contact with the gate insulating film 231, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (e.g., InN or ZnN) is preferably provided between the gate electrode 233 and the gate insulating film 231. These films each have a work function of 5 eV or higher, preferably 5.5 eV or higher; thus, the threshold voltage of the transistor can be positive. Accordingly, a so-called normally-off switching element can be formed. For example, when an In—Ga—Zn—O film containing nitrogen is used, an In—Ga—Zn—O film in which the nitrogen concentration higher than at least that of the oxide semiconductor film 229, specifically an In—Ga—Zn—O film in which the nitrogen concentration is 7 atomic % or higher, is used.

Note that after the gate insulating film 231 is formed, heat treatment may be performed in an inert gas atmosphere or an oxygen atmosphere. The heat treatment temperature is preferably a temperature of from 200° C. to 450° C., more preferably, from 250° C. to 350° C. With such heat treatment, variation in electric characteristics of the transistor can be reduced. When oxygen is contained in the gate insulating film 231 or the insulating film 225 which is in contact with the oxide semiconductor film 229, oxygen can be supplied to the oxide semiconductor film 229 and the oxygen defects in the oxide semiconductor film 229 can be repaired. As described above, the heat treatment has an effect of supplying oxygen; therefore, the heat treatment can also be referred to as supply of oxygen.

Note that in this embodiment, the heat treatment for supply of oxygen is performed after the gate insulating film 231 is formed; however, the timing of the heat treatment for supply of oxygen is not limited thereto, and the heat treatment may be performed any time after formation of the gate insulating film 231 as appropriate.

As described above, the heat treatment for dehydration or dehydrogenation and the heat treatment for supply of oxygen are performed to reduce impurities and fill oxygen vacancies in the oxide semiconductor film 229, whereby the oxide semiconductor film 229 can be highly purified so as to contain impurity elements that are not main components of the oxide semiconductor film 229 as little as possible.

Figure 14A:
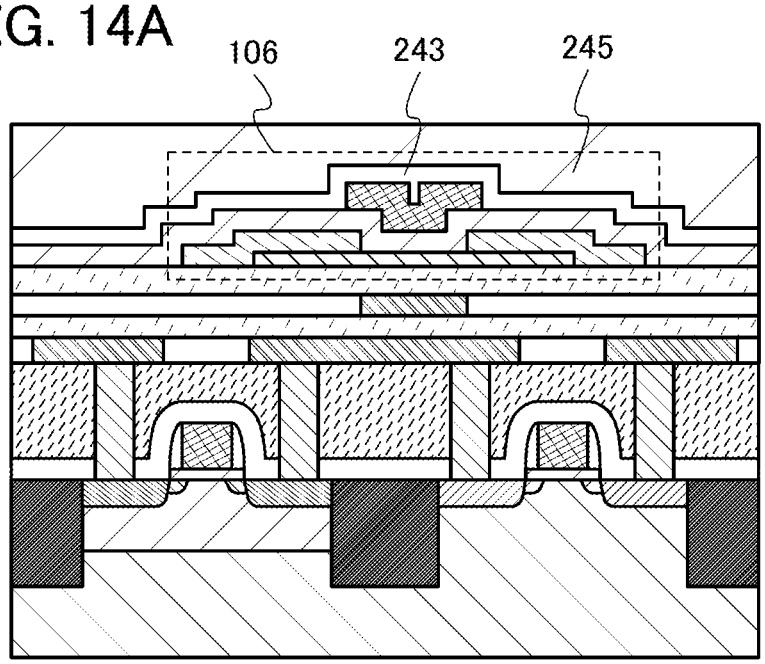
FIGS. 14A and 14B are cross-sectional views of the semiconductor device according to one embodiment of the disclosed invention.
Figure 14B:
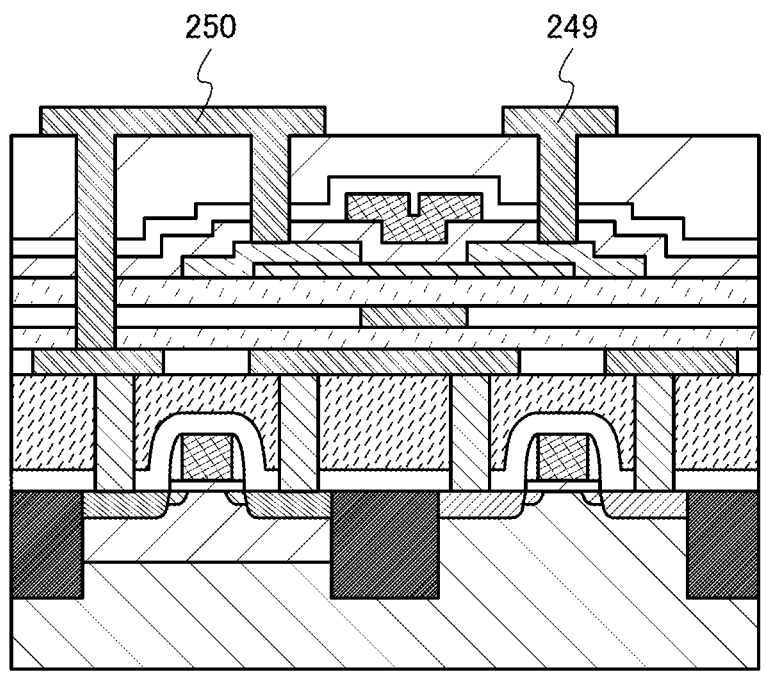

Next, as illustrated in FIG. 14A, an insulating film 243 and an insulating film 245 are formed by a sputtering method, a CVD method, a coating method, a printing method, or the like.

The insulating films 243 and 245 may each be formed with a single layer or a stacked layer including one or more of silicon oxide, silicon oxynitride, silicon nitride oxide, silicon nitride, aluminum oxide, aluminum oxynitride, aluminum nitride oxide, aluminum nitride, and the like. Note that with the use of an insulating film that prevents diffusion of oxygen to the outside as the insulating film 245, oxygen released from the insulating film 243 can be supplied to an oxide semiconductor film. Typical examples of the insulating film that prevents diffusion of oxygen to the outside include films of aluminum oxide, aluminum oxynitride, and the like. In addition, with the use of an insulating film that prevents diffusion of hydrogen from the outside as the insulating film 245, diffusion of hydrogen from the outside to the oxide semiconductor film can be reduced, and vacancies in the oxide semiconductor film can be reduced. Typical examples of the insulating film that prevents diffusion of hydrogen from the outside include films of silicon nitride, silicon nitride oxide, aluminum nitride, aluminum nitride oxide, and the like. Further, when the insulating film 243 has a three-layer structure of an oxide insulating film from which part of oxygen is released by heating, an insulating film which prevents diffusion of oxygen to the outside, and an oxide insulating film, oxygen can be efficiently diffused to the oxide semiconductor film and oxygen can be prevented from being released to the outside; accordingly, variation in transistor characteristics can be reduced even at high temperature and in high humidity.

Through the above steps, as illustrated in FIG. 14A, the transistor 106 including an oxide semiconductor film can be formed.

As described above, the oxide semiconductor film 229 is preferably highly purified by sufficient removal of impurities such as hydrogen and sufficient supply with oxygen so as to be supersaturated with oxygen. Specifically, the hydrogen concentration in the oxide semiconductor film 229 is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower. Note that the hydrogen concentration in the oxide semiconductor film 229 is measured by secondary ion mass spectrometry (SIMS). When the oxide semiconductor film 229 in which the hydrogen concentration is sufficiently reduced to be highly purified and defect levels in an energy gap resulting from oxygen vacancies are reduced by sufficient supply of oxygen is used for the transistor 106, off-state current (per unit channel width (1 μm) here) at room temperature (25° C.) is 100 zA (1 zA (zeptoampere) is $1 \times 10^{-21}$ A) or lower, preferably 10 zA or lower, for example. In this manner, with the use of an intrinsic (i-type) or substantially i-type oxide semiconductor film 229, the transistor 106 having very favorable off-state current characteristics can be formed.

Note that the transistor 106 has a top-gate structure in this embodiment; however, the present invention is not limited to the top-gate structure and the transistor 106 may have a bottom-gate structure, for example.

Next, parts of the insulating films 221, 225, 243, and 245 are selectively etched, so that opening portions are formed to expose parts of the wiring 223a, the electrode 241a, and the electrode 241b. After a conductive film is formed in the opening portions, parts of the conductive film are selectively etched; thus, a wiring 249 in contact with the electrode 241b and a wiring 250 in contact with the electrode 241a are formed. The wiring 249 and the wiring 250 can be formed using the same material as that of the contact plugs 219a and 219b as appropriate.

Here, the wiring 250 corresponds to one of the source terminal and the drain terminal of the transistor 106 illustrated in FIG. 1A, and is electrically connected to the wiring 223c corresponding to the source terminal of the transistor 102. In addition, the wiring 249 corresponds to the other of the source terminal and the drain terminal of the transistor 106 illustrated in FIG. 1A, and is electrically connected to the low potential power supply line. Further, the gate electrode 233 of the transistor 106 serves as the control terminal IN_S illustrated in FIG. 1A.

Through the above steps, the semiconductor device including the transistors 101, 102, and 106 can be manufactured.

Further, preferably, at least a part of the transistor 106 overlaps with at least parts of the transistors 101 and 102. With such a planar layout, an increase in area occupied by the CPU due to provision of the transistor including a semiconductor allowing low off-state current such as an oxide semiconductor can be suppressed.

In the above-described manner, the transistor 106 can be formed using a material that can reduce off-state current of a transistor greatly, e.g., an oxide semiconductor that is a wide gap semiconductor, over a semiconductor substrate provided with a CMOS circuit. By provision of the transistor 101, the transistor 102 and the transistor 106, shoot-through current generated in logic inversion of the CMOS inverter circuit 100 can be reduced. Therefore, power consumption in an operation period of the semiconductor device in this embodiment can be reduced.

The structures, methods, and the like in this embodiment can be combined with each other, or can also be combined with any of structures, methods, and the like in the other embodiments as appropriate.

Embodiment 3

A semiconductor device disclosed in this specification can be applied to a variety of electronic devices (including game machines). Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 15A and 15B.

Figure 15A:
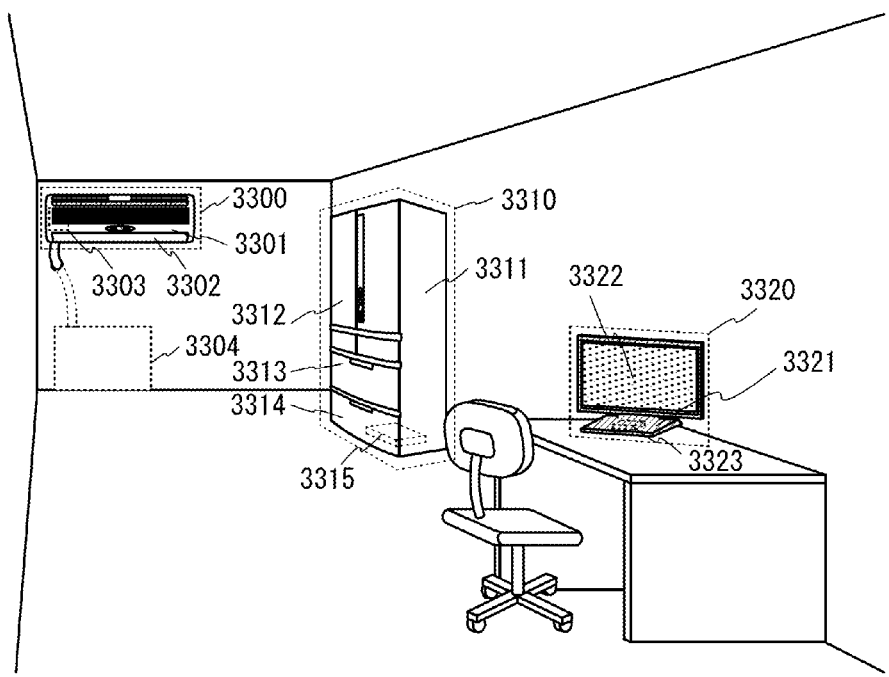
FIGS. 15A and 15B illustrate electronic devices each using a semiconductor device according to one embodiment of the disclosed invention.
Figure 15B:
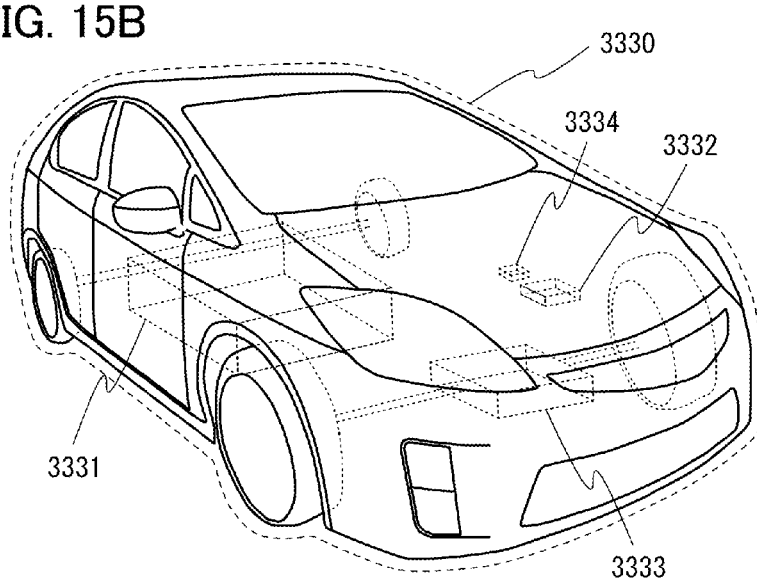

In FIG. 15A, an air conditioner including an indoor unit 3300 and an outdoor unit 3304 is an example of an electronic device using the semiconductor device which is disclosed in the above embodiment for a CPU. Specifically, the indoor unit 3300 includes a housing 3301, an air outlet 3302, a CPU 3303, and the like. Although the CPU 3303 is provided in the indoor unit 3300 in FIG. 15A, the CPU 3303 may be provided in the outdoor unit 3304. Alternatively, the CPU 3303 may be provided in the indoor unit 3300 and the outdoor unit 3304 both. The CPU using the semiconductor device described in the above-described embodiment can save power in an operation period of the CPU, and thereby, power consumption of the air conditioner can be lowered.

In FIG. 15A, an electric refrigerator-freezer 3310 is an example of an electronic device having the CPU formed using an oxide semiconductor. Specifically, the electric refrigerator-freezer 3310 includes a housing 3311, a door 3312 for a refrigerator, a door 3313 for a freezer, a door 3314 for a vegetable drawer, a CPU 3315, and the like. In FIG. 15A, the CPU 3315 is provided in the housing 3311. When a CPU including the semiconductor device, which is disclosed in the above embodiment, is used as the CPU 3315 of the electric refrigerator-freezer 3310, power consumption of the electric refrigerator-freezer 3310 can be lowered.

In FIG. 15A, an image display device 3320 is an example of an electronic device having the CPU formed using an oxide semiconductor. Specifically, the image display device 3320 includes a housing 3321, a display portion 3322, a CPU 3323, and the like. The CPU 3323 is provided in the housing 3321 in FIG. 15A. When a CPU including the semiconductor device, which is disclosed in the above embodiment, is used as the CPU 3323 in the video display device 3320, power consumption of the video display device 3320 can be lowered.

FIG. 15B illustrates an example of an electric vehicle. An electric vehicle 3330 is equipped with a secondary battery 3331. The output of the electric power of the secondary battery 3331 is adjusted by a control circuit 3332 and the electric power is supplied to a driving device 3333. The control circuit 3332 is controlled by a processing unit 3334 including a ROM, a RAM, a CPU, or the like, which is not illustrated. When a CPU including the semiconductor device, which is disclosed in the above embodiment, is used as the CPU in the electric vehicle 3330, power consumption in an operation period of the electric vehicle 3330 can be lowered.

The driving device 3333 includes a DC motor or an AC motor either alone or the motor in combination with an internal-combustion engine. The processing unit 3334 outputs a control signal to the control circuit 3332 based on input data such as data of operation (e.g., acceleration, deceleration, or stop) by a driver or data during driving (e.g., data on an upgrade or a downgrade, or data on a load on a driving wheel) of the electric vehicle 3330. The control circuit 3332 adjusts the electric energy supplied from the secondary battery 3331 depending on the control signal of the processing unit 3334 to control the output of the driving device 3333. If the AC motor is mounted, although not illustrated, an inverter which converts direct current into alternate current is also incorporated.

This embodiment can be combined with any of the other embodiments as appropriate.

This application is based on Japanese Patent Application serial no. 2012-178536 filed with Japan Patent Office on Aug. 10, 2012, the entire contents of which are hereby incorporated by reference.

What is claimed is:

1. A semiconductor device comprising:
a first transistor;
a second transistor; and
a third transistor,
wherein the first transistor and the second transistor have different conductivity types,
wherein each of the first transistor and the second transistor comprises a channel formation region comprising a first semiconductor,
wherein the third transistor comprises a channel formation region comprising a second semiconductor having a band gap wider than the first semiconductor,
wherein a gate of the first transistor is electrically connected to a gate of the second transistor,
wherein one of a source and a drain of the first transistor is electrically connected to a first power supply line,
wherein the other of the source and the drain of the first transistor is electrically connected to one of a source and a drain of the second transistor,
wherein the other of the source and the drain of the second transistor is electrically connected to one of a source and a drain of the third transistor,
wherein the other of the source and the drain of the third transistor is electrically connected to a second power supply line, and
wherein the third transistor is configured to be turned off when the first transistor is switched from an on state to an off state and the second transistor is switched from an off state to an on state or when the first transistor is switched from the off state to the on state and the second transistor is switched from the on state to the off state.

2. The semiconductor device according to claim 1, wherein a potential of the first power supply line is higher than a potential of the second power supply line.

3. The semiconductor device according to claim 1, wherein the third transistor is turned off, at least when a voltage applied to the gate of the first transistor and the gate of the second transistor is higher than a potential of the second power supply line and lower than a potential of the first power supply line.

4. The semiconductor device according to claim 1, wherein the third transistor is turned off, at least when a voltage applied to the gate of the first transistor and the gate of the second transistor is lower than a potential of the second power supply line and higher than a potential of the first power supply line.

5. The semiconductor device according to claim 1, wherein the second semiconductor is an oxide semiconductor.

6. The semiconductor device according to claim 1, wherein the first semiconductor is silicon.

7. An electronic device comprising a CPU comprising the semiconductor device according to claim 1.

8. A semiconductor device comprising:
a first transistor;
a second transistor; and
a third transistor,
wherein the first transistor and the second transistor have different conductivity types,
wherein each of the first transistor and the second transistor comprises a channel formation region comprising a first semiconductor,
wherein the third transistor comprises a channel formation region comprising a second semiconductor having a band gap wider than the first semiconductor,
wherein a gate of the first transistor is electrically connected to a gate of the second transistor,
wherein one of a source and a drain of the first transistor is electrically connected to a first power supply line,
wherein the other of the source and the drain of the first transistor is electrically connected to one of a source and a drain of the third transistor,
wherein one of a source and a drain of the second transistor is electrically connected to the other of the source and the drain of the third transistor,
wherein the other of the source and the drain of the second transistor is electrically connected to a second power supply line, and
wherein the third transistor is configured to be turned off when the first transistor is switched from an on state to an off state and the second transistor is switched from an off state to an on state or when the first transistor is switched from the off state to the on state and the second transistor is switched from the on state to the off state.

9. The semiconductor device according to claim 8, wherein a potential of the first power supply line is higher than a potential of the second power supply line.

10. The semiconductor device according to claim 8, wherein the third transistor is turned off, at least when a voltage applied to the gate of the first transistor and the gate of the second transistor is higher than a potential of the second power supply line ing and lower than a potential of the first power supply line.

11. The semiconductor device according to claim 8, wherein the third transistor is turned off, at least when a voltage applied to the gate of the first transistor and the gate of the second transistor is lower than a potential of the second power supply line and higher than a potential of the first power supply line.

12. The semiconductor device according to claim 8, wherein the second semiconductor is an oxide semiconductor.

13. The semiconductor device according to claim 8, wherein the first semiconductor is silicon.

14. An electronic device comprising a CPU comprising the semiconductor device according to claim 8.

15. A method for driving a semiconductor device comprising a first transistor, a second transistor and a third transistor, wherein a gate of the first transistor is electrically connected to a gate of the second transistor, wherein one of a source and a drain of the first transistor is electrically connected to a first power supply line, wherein the other of the source and the drain of the first transistor is electrically connected to one of a source and a drain of the second transistor, wherein the other of the source and the drain of the second transistor is electrically connected to one of a source and a drain of the third transistor, and wherein the other of the source and the drain of the third transistor is electrically connected to a second power supply line, the method comprising the steps of:
- turning off the third transistor;
- changing a potential of the gate of the first transistor and the gate of the second transistor after turning off the third transistor; and
- turning on the third transistor after changing the potential of the gate of the first transistor and the gate of the second transistor.

16. The method for driving a semiconductor device according to claim 15, wherein the third transistor is in an off state while the potential of the gate of the first transistor and the second transistor changes.

17. A method for driving a semiconductor device comprising a first transistor, a second transistor and a third transistor, wherein a gate of the first transistor is electrically connected to a gate of the second transistor, wherein one of a source and a drain of the first transistor is electrically connected to a first power supply line, wherein the other of the source and the drain of the first transistor is electrically connected to one of a source and a drain of the third transistor, wherein one of a source and a drain of the second transistor is electrically connected to the other of the source and the drain of the third transistor, and wherein the other of the source and the drain of the second transistor is electrically connected to a second power supply line, the method comprising the steps of:
- turning off the third transistor;
- changing a potential of the gate of the first transistor and the gate of the second transistor after turning off the third transistor; and
- turning on the third transistor after changing the potential of the gate of the first transistor and the gate of the second transistor.

18. The method for driving a semiconductor device according to claim 17, wherein the third transistor is in an off state while the potential of the gate of the first transistor and the second transistor changes.

\* \* \* \* \*